(12) United States Patent
Cottet et al.

(10) Patent No.: US 9,113,578 B2
(45) Date of Patent: Aug. 18, 2015

(54) THERMOSIPHON COOLER ARRANGEMENT IN MODULES WITH ELECTRIC AND/OR ELECTRONIC COMPONENTS

(71) Applicant: ABB Technology AG, Zürich (CH)

(72) Inventors: Didier Cottet, Zürich (CH); Francesco Agostini, Zofingen (CH); Thomas Gradinger, Aarau Rohr (CH); Andreas Vögeli, Döttingen (CH)

(73) Assignee: ABB TECHNOLOGY AG, Zürich (CH)

( * ) Notice: Subject to any disclaimer, the term of this patent is extended or adjusted under 35 U.S.C. 154(b) by 146 days.

(21) Appl. No.: 13/664,878

(22) Filed: Oct. 31, 2012

(65) Prior Publication Data

US 2013/0107455 A1    May 2, 2013

(30) Foreign Application Priority Data

Oct. 31, 2011    (EP) .................................. 11187272

(51) Int. Cl.
*H05K 7/20* (2006.01)
*H01L 23/473* (2006.01)
(Continued)

(52) U.S. Cl.
CPC ........ *H05K 7/20672* (2013.01); *H05K 7/20936* (2013.01); *H02M 7/003* (2013.01); *H02M 2007/4835* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC .......... 361/679.46–679.54, 688–723, 679.52, 361/679.53, 679.47; 165/80.4–80.5, 165/104.33, 185; 174/15.1–15.2, 174/16.1–16.2, 521, 526, 547–548; 257/714–715, E23.088; 363/141; 454/184; 312/236

See application file for complete search history.

(56) References Cited

U.S. PATENT DOCUMENTS 5,582,242 A * 12/1996 Hamburgen et al. .... 165/104.21
5,606,341 A *  2/1997 Aguilera ......................... 345/87
(Continued)

FOREIGN PATENT DOCUMENTS

JP    A-4-203893    7/1992
JP    08078589 A *  3/1996 ............ H01L 23/427
(Continued)

OTHER PUBLICATIONS

European Search Report issued on Dec. 29, 2011, for European Application No. 11187272.7.
(Continued)

*Primary Examiner* — Anthony Haughton
*Assistant Examiner* — Razmeen Gafur
(74) *Attorney, Agent, or Firm* — Buchanana Ingersoll & Rooney PC

(57) ABSTRACT

A thermosiphon cooler arrangement is provided for the cooling of electric and/or electronic components, including a module of an electric and/or electronic system. The module includes a guiding structure and an inlet for receiving a stream of cooling air, and an outlet for releasing cooling air thereafter in an operating state of the module. The guiding structure is provided for guiding the cooling air entering through the inlet and leaving the module through the outlet in an operating state of the module. The module includes a thermosiphon cooler with an evaporator and a condenser for transferring a majority of a heat load to the cooling air in an operating state of the module. The evaporator is tilted with respect to the condenser wherein the condenser is arranged such that a major portion of the cooling air flows through the condenser.

26 Claims, 12 Drawing Sheets

(51) Int. Cl.
  *H02M 7/483* (2007.01)
  *H02M 7/00* (2006.01)

(56) References Cited

U.S. PATENT DOCUMENTS

| | | | |
|---|---|---|---|
| 5,713,413 A * | 2/1998 | Osakabe et al. | 165/104.33 |
| 5,737,923 A * | 4/1998 | Gilley et al. | 62/3.7 |
| 5,806,583 A * | 9/1998 | Suzuki et al. | 165/104.33 |
| 5,823,248 A * | 10/1998 | Kadota et al. | 165/104.33 |
| 5,978,220 A | 11/1999 | Frey et al. | |
| 6,039,111 A * | 3/2000 | Kawaguchi et al. | 165/104.14 |
| 6,097,597 A * | 8/2000 | Kobayashi | 361/679.47 |
| 6,119,767 A | 9/2000 | Kadota et al. | |
| 6,125,926 A * | 10/2000 | Okamoto et al. | 165/166 |
| 6,226,178 B1 * | 5/2001 | Broder et al. | 361/679.52 |
| 6,313,991 B1 | 11/2001 | Nagashima et al. | |
| 6,357,517 B1 * | 3/2002 | Osakabe et al. | 165/104.33 |
| 6,388,882 B1 * | 5/2002 | Hoover et al. | 361/704 |
| 6,404,628 B1 | 6/2002 | Nagashima et al. | |
| 6,414,867 B2 | 7/2002 | Suzuki et al. | |
| 6,434,003 B1 | 8/2002 | Roy et al. | |
| 6,437,981 B1 * | 8/2002 | Newton et al. | 361/700 |
| 6,474,074 B2 * | 11/2002 | Ghoshal | 62/3.7 |
| 6,714,413 B1 * | 3/2004 | Ghosh et al. | 361/700 |
| 7,061,759 B2 * | 6/2006 | Karppinen et al. | 361/695 |
| 7,422,052 B2 * | 9/2008 | Reyzin et al. | 165/80.3 |
| 7,859,838 B2 * | 12/2010 | Pesonen | 361/695 |
| 8,648,462 B2 | 2/2014 | Ushijima | |
| 2001/0000201 A1 | 4/2001 | Osakabe et al. | |
| 2004/0012983 A1 | 1/2004 | Fearing et al. | |
| 2004/0223301 A1 | 11/2004 | Muller et al. | |
| 2005/0162836 A1 | 7/2005 | Briggs et al. | |
| 2005/0168938 A1 | 8/2005 | Bash et al. | |
| 2005/0248922 A1 | 11/2005 | Chu et al. | |
| 2006/0162898 A1 * | 7/2006 | Reyzin et al. | 165/80.4 |
| 2006/0243422 A1 | 11/2006 | Sakai et al. | |
| 2007/0042514 A1 | 2/2007 | Wu et al. | |
| 2007/0138623 A1 * | 6/2007 | Maveety et al. | 257/706 |
| 2007/0165376 A1 | 7/2007 | Bones et al. | |
| 2007/0227703 A1 * | 10/2007 | Bhatti et al. | 165/104.26 |
| 2007/0246193 A1 * | 10/2007 | Bhatti et al. | 165/104.21 |
| 2007/0246197 A1 * | 10/2007 | Reyzin et al. | 165/104.33 |
| 2008/0070500 A1 | 3/2008 | Rapp | |
| 2008/0236790 A1 * | 10/2008 | Bhatti et al. | 165/80.3 |
| 2009/0040724 A1 | 2/2009 | Nishikimi et al. | |
| 2009/0080155 A1 | 3/2009 | Takahashi et al. | |
| 2009/0086427 A1 | 4/2009 | Okumura et al. | |
| 2010/0025126 A1 | 2/2010 | Nakatsu et al. | |
| 2010/0073866 A1 | 3/2010 | Toyoda et al. | |
| 2010/0118493 A1 | 5/2010 | Huang et al. | |
| 2010/0188813 A1 | 7/2010 | Nakatsu et al. | |
| 2010/0208427 A1 | 8/2010 | Horiuchi et al. | |
| 2010/0270010 A1 * | 10/2010 | Agostini | 165/104.27 |
| 2010/0290604 A1 | 11/2010 | Wright et al. | |
| 2011/0013364 A1 | 1/2011 | Howes et al. | |
| 2011/0188204 A1 | 8/2011 | Horiuchi et al. | |
| 2011/0249402 A1 | 10/2011 | Hentschel et al. | |
| 2011/0271696 A1 * | 11/2011 | Hedberg et al. | 62/64 |
| 2011/0286185 A1 | 11/2011 | Abe et al. | |
| 2012/0014063 A1 | 1/2012 | Weiss | |
| 2012/0075795 A1 | 3/2012 | Petruzzo | |
| 2012/0140403 A1 * | 6/2012 | Lau et al. | 361/679.47 |
| 2012/0147561 A1 * | 6/2012 | Feng et al. | 361/692 |
| 2012/0186291 A1 * | 7/2012 | Kallmark et al. | 62/259.2 |
| 2012/0234034 A1 | 9/2012 | Nakano et al. | |

FOREIGN PATENT DOCUMENTS

| | | |
|---|---|---|
| JP | A-11-173723 | 7/1999 |
| JP | A-9-326582 | 9/2001 |
| JP | A-2001-244395 | 9/2001 |
| JP | A-2003-139476 | 5/2003 |
| JP | A-2009-147367 | 7/2009 |
| JP | A-2010-238805 | 10/2010 |
| WO | WO 2010/027311 A1 | 3/2010 |
| WO | WO 2011/035943 A2 | 3/2011 |
| WO | WO 2011/064972 A1 | 6/2011 |

OTHER PUBLICATIONS

European Search Report Issued on Mar. 15, 2012, European Application No. 11187277.6.

Jun. 30, 2015 Notice of Allowance issued in U.S. Appl. No. 13/664,927.

* cited by examiner

THERMOSIPHON COOLER ARRANGEMENT IN MODULES WITH ELECTRIC AND/OR ELECTRONIC COMPONENTS

RELATED APPLICATIONS

This application claims priority under 35 U.S.C. §119 to European Patent Application No. 11187272.7 filed in Europe on Oct. 31, 2011, the entire content of which is hereby incorporated by reference in its entirety.

FIELD

The present disclosure relates to the removal of heat from electric and electronic components. More particularly, the present disclosure relates to a module of an electric and/or electronic system and an electric and/or electronic system with a cabinet including at least two modules.

BACKGROUND INFORMATION

Electric and electronic devices or systems are cooled in operation in order to avoid excessive temperatures and consequently failure of the devices. Such electronic devices or systems can include, for example, electric and electronic devices in an electric and/or electronic system with a cabinet. Electric and electronic applications feature not only high rates of heat generation by the devices, but also high power densities, for example, heat fluxes.

Medium voltage power electronic converters to be inserted in a cabinet may be built in a modular way, using a large number of identical units to facilitate flexible and economic production, customer-specific configuration and servicing. One topology of power converters may consist of a large number of identical cells, wherein each cell functionally consists of two switches and one capacitor. The switches may be Insulated Gate Bipolar Transistors (IGBTs) with anti-parallel diodes. Both switches may be available in the form of an IGBT module. Several IGBT modules can be put in parallel to increase the current rating.

Air cooling systems for cooling electric or electronic devices in a cabinet may include an array of fins extending from a base plate and may utilize at least one fan for forced convection in order to reduce the thermal load of the electric or electronic devices by dumping the heat to a location distant to the electric or electronic devices.

SUMMARY

An exemplary embodiment of the present disclosure provides a module of an electric and/or electronic system. The exemplary module includes a guiding structure having an inlet for receiving a stream of cooling air, and an outlet for releasing the stream of cooling air thereafter in an operating state of the module. The guiding structure is configured to guide the cooling air through the inlet, from there through the module, and thereafter through the outlet in an operating state of the module. The exemplary module also includes a thermosiphon cooler. The thermosiphon cooler includes an evaporator for receiving a first heat load generated by at least one electric and/or electronic component of the module in an operating state of the module, and includes a condenser for transferring a majority of the first heat load to the cooling air such that a major portion of the stream of cooling air is allowed to flow through openings in the condenser in an operating state of the module. The evaporator is tilted with respect to the condenser about a tilt axis. The at least one electric and/or electronic component is thermally connectable to a planar second face of the evaporator such that the at least one electric and/or electronic component is located in between the inlet and the outlet. The evaporator includes a plurality of first conduits extending below and alongside the second face of the evaporator. The condenser is arranged between the inlet and the outlet such that a major portion of the cooling air flows in a flow direction transverse to a planar shaped first face of the condenser through the condenser to transfer the majority of the first heat load to the cooling air in an operating state of the module.

An exemplary embodiment of the present disclosure provides an electric and/or electronic system with a cabinet. The cabinet includes at least two of the above-described modules. The cabinet also includes a cabinet housing including a first aperture for receiving a stream of cooling air, and a second aperture for releasing the cooling air thereafter in an operating state of the cabinet. The at least two modules are arranged in the cabinet housing such that a major portion of the stream of cooling air flowing through the first aperture of the cabinet housing is divided into partial streams of cooling air. The guiding structure enables at least some of the partial streams to flow into their dedicated module via the inlet through the dedicated module to the outlet of the dedicated module, respectively, such that at least two of the partial streams of cooling air are connected in parallel to one another and thereafter leave the cabinet together through the second aperture of the cabinet housing in an operating state of the cabinet.

BRIEF DESCRIPTION OF THE DRAWINGS

Additional refinements, advantages and features of the present disclosure are described in more detail below with reference to exemplary embodiments illustrated in the drawings, in which.

The reference signs used in the drawings and their meanings are listed in summary form as a list of reference signals. In principle, identical or similarly functioning parts are provided with the same reference symbols in the drawings.

DETAILED DESCRIPTION

Figures 1, 2, 3:
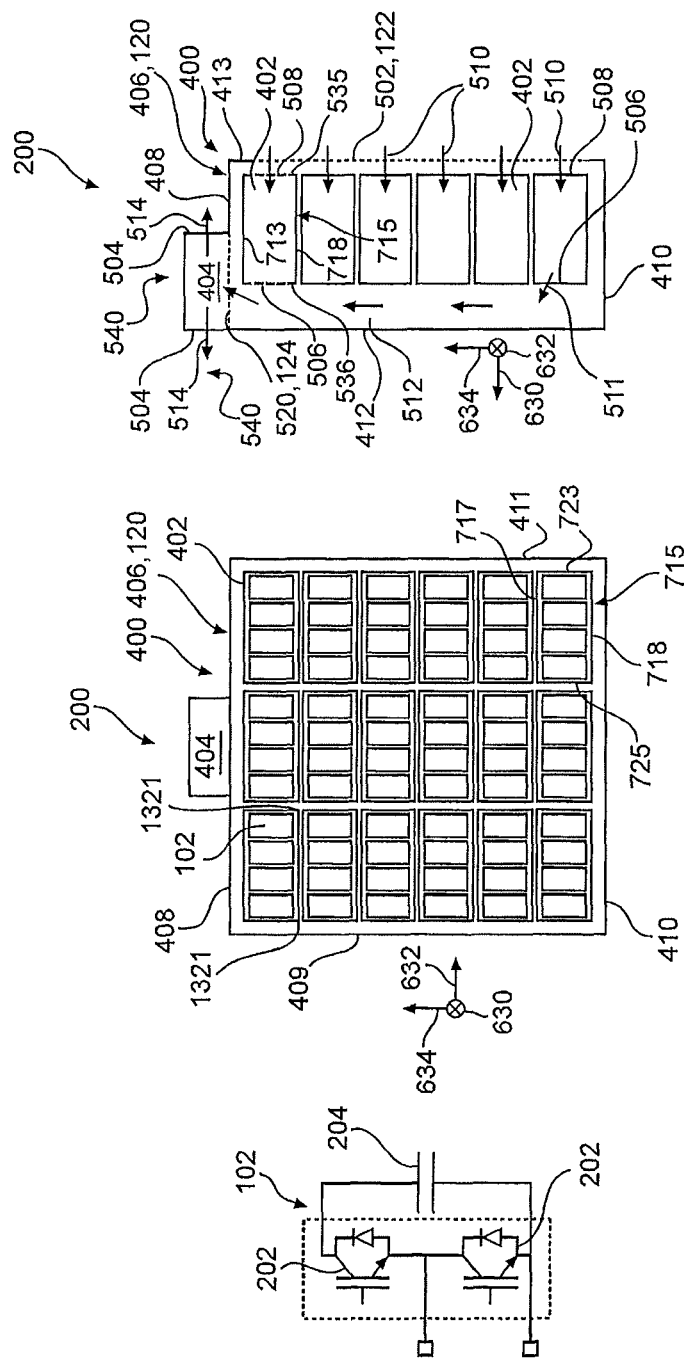
FIG. 1 schematically shows a module with two switches and one capacitor.
FIG. 2 schematically shows a cross-sectional front view of an electric and/or electronic system with a cabinet according to an exemplary embodiment of the present disclosure.
FIG. 3 schematically shows a cross-sectional side view of the electric and/or electronic system of FIG. 2.

Exemplary embodiments of the present disclosure provide for an improved, efficient and flexible heat removal from electric and electronic components.

Exemplary embodiments of the present disclosure provide a module of an electric and/or electronic system and an electric and/or electronic system with a cabinet including at least two modules, as described in more detail below.

According to an exemplary embodiment of the present disclosure, a module of an electric and/or electronic system includes a guiding structure having an inlet for receiving a stream of cooling air and an outlet for releasing cooling air thereafter in an operating state of the module. The guiding structure is configured to guide the cooling air through the inlet, from there through the module, and thereafter through the outlet in an operating state of the module. A thermosiphon cooler is provided to include an evaporator for receiving a first heat load generated by at least one electric and/or electronic component of the module in an operating state of the module. The thermosiphon cooler includes a condenser for transferring a majority of the first heat load to the cooling air in an operating state of the module. The evaporator is tilted with respect to the condenser about a tilt axis about a tilting angle. The at least one electric and/or electronic component is thermally connectable to a planar second face of the evaporator such that the at least one electric and/or electronic component is located in between the inlet and the outlet. By this arrangement, it becomes possible to have the at least one electric and/or electronic cooled additionally by the stream of cooling air.

In accordance with an exemplary embodiment, the evaporator includes a plurality of first conduits extending below and alongside the second face of the evaporator. In accordance with an exemplary embodiment of the evaporator, the first conduits of the evaporator are dimensioned such that the coolant is vaporizable by convection boiling contributing to a good overall thermal efficiency of the thermosiphon heat exchanger.

The condenser is arranged between the inlet and the outlet such that a major portion of the cooling air flows in a flow direction transverse to a planar shaped first face of the condenser through the condenser to transfer the majority of the first heat load to the cooling air in an operating state of the module. For allowing a major portion of the stream of cooling air to flow through the condenser, the condenser features for example a grill-like structure having openings in between structural elements. The openings form the contact surface for the stream of cooling air whereas an interior surface of the grill-type condenser forms a contact surface for the phase-changing coolant within the thermosiphon.

Such a module with a thermosiphon cooler wherein the evaporator is tilted with respect to the condenser may be provided to provide a large cross-sectional area inside the module open to the airflow, or in other words to block as little of the airflow cross-section of the module by tilting the evaporator with respect to the condenser such that after passing the condenser small pressure drop of the cooling air may be achieved and the whole module can be effected smaller, cheaper and less noisy. By providing such a module an efficient usage of the space in the module and hence high compactness may be achieved as well as high cooling performances for electric and/or electronic components such as IGBTs and the module may be achieved by providing such a thermosiphon cooler. Such a module may provide for an economic, efficient and flexible cooling of a module while at the same time ensuring a compact design of the module.

If it is desired to achieve an improved, and more efficient cooling of the module by cooling air, this may be achieved by a module having a thermosiphon cooler, wherein the evaporator is tilted with respect to the condenser, as little of the airflow cross-section of the condenser inside the module is blocked by the evaporator due to tilting the evaporator with respect to the condenser either about the horizontal direction of the module or about the vertical direction of the module. The evaporator may be tilted by an angle of 90° about a tilt axis (i.e. a tilting axis) with respect to the condenser, for example, providing for a most efficient airflow through the condenser, wherein as less of the airflow cross-section of the condenser as possible is blocked by the evaporator in an operating state of the module. The tilting angle may be greater than 30° and less than 150° providing for an optimized and efficient cooling and heat removal of the electric and/or electronic component(s) inside the module. The condenser is fluidly connected to the evaporator by a plurality of second conduits of the condenser being fluidly connected to plurality of first conduits of the evaporator such that a motion of a coolant of the thermosiphon cooler is provided by gravity in an operating state of the thermosiphon cooler. The evaporator may be arranged geometrically offset to the condenser. The term offset shall not be understood narrowly in the sense of an axial displacement of the condenser relative to the evaporator wherein the condenser and the evaporator both have the same orientation, i.e. the first face of the condenser and the second face of the evaporator pointing in the same direction. In the context of the disclosure of the present disclosure, the term offset shall encompass also thermosiphon coolers whose first face of the condenser is oriented in another direction relative to the second face of the evaporator such that the perpendiculars of the first face and the second face are transverse to one another.

High air velocities and high pressure drop of the cooling air over the condenser possibly occurring in a module in which the evaporator is arranged in a bottom part of the module not tilted to the condenser which is arranged at a top part of the module and wherein cooling air flows through a top and bottom part through the inlet of the module for cooling capacitors at the top and bottom part and exits through the condenser at the top part in an operating state of the module may be avoided or at least reduced by a tilted arrangement of the evaporator with respect to the condenser. It may be avoided that the dynamic pressure $\Box v^2/2$ in the free jet after the condenser may be lost if there is no diffuser behind the condenser which would further increase the pressure drop.

By providing a thermosiphon cooler with a tilted evaporator with respect to the condenser in the module the advantages of a modular arrangement of modules in a cabinet, of cabinet air-flow management and two-phase cooling by means of the thermosiphon cooler in the module may be utilized without the drawback of low compactness of the module or high pressure drop of the cooling air flow at the condenser compared to common heat sinks.

If a simple and efficient exchange or a transfer of a heat load from the electric or electronic components inside the module is desired, this object may be achieved by providing an evaporator with a planar-shaped second face which is extending in a lateral direction of the module, the lateral direction being transverse to a vertical direction and a horizontal direction of the module and thus receiving a major load of the heat of the electric or electronic components which is transferred to the condenser.

According to an exemplary embodiment of the present disclosure, the evaporator is arranged at a position offset to the condenser.

If it is desired to achieve an even more compact module with a lower height or lower width of the module, the evaporator may be positioned to be offset to the condenser.

According to an exemplary embodiment of the present disclosure, the first face of the condenser is arranged in a first plane defined by a vertical direction and a horizontal direction of the module, the horizontal direction being transverse to the vertical direction and transverse to a lateral direction of the module. The evaporator is tilted with respect to the condenser about the horizontal direction about the tilt axis by an angle. The angle may be greater than 30° and less than 150° between a first main normal direction of a planar shaped first face of the condenser and a second main normal direction of a planar shaped second face of the evaporator which may be configured for thermally connecting to the at least one electric and/or electronic component. The angle may be selected from the group consisting of an angle of 90°, an angle of essentially 90°, an acute angle, an obtuse angle, and an angle region of 85°-95°, 60°-120°, 45°-135°, 60°-90°, 90°-120°, 45°-90°, 90°-135°, greater than 0°-45°, 135° to less than 180°. The plurality of second conduits of the condenser which is fluidly connected to the plurality of first conduits of the evaporator may be formed such that a coolant motion is provided by gravity in an operating state of the module, and the thermosiphon cooler, respectively.

If it is desired to achieve a compact module with an efficient optimized cooling, this object may be achieved by such a module wherein the evaporator is tilted with respect to the condenser about the horizontal direction.

According to an exemplary embodiment of the present disclosure, the first face of the condenser is arranged in a first plane defined by a vertical direction and a horizontal direction of the module, the horizontal direction being transverse to the vertical direction and transverse to a lateral direction of the module. The evaporator is tilted with respect to the condenser about the vertical direction by an angle. Particularly compact modules are achievable if the angle is about 90 degrees. The angle may have different sizes as described according to the aspects or exemplary embodiments mentioned herein.

By providing such a module wherein the evaporator is tilted with respect to the condenser about the vertical direction, a compact module may be achieved while ensuring an efficient flexible and improved cooling of the module, or heat removal from electric and/or electronic components of the module.

According to an exemplary embodiment of the present disclosure, the module further includes at least one electric capacitor being electrically connected to the at least one electric and/or electronic component. A majority of a second heat load generateable (e.g., to be generated) by the at least one electric capacitor is removable by the cooling air via the outlet in an operating state of the module.

By providing such a module, it may be achieved that a first heat load generated by an electric and/or electronic component such as an IGBT and a second heat load generateable by at least one capacitor inside the module may be removable by the cooling air flowing through the inlet, through the module, guided by the guiding structure, and to the outlet of the module, thereby passing the capacitors and the condenser inside the module. The capacitor may be made of several physical capacitors. Generally, n (physical) capacitors are put in series to reach the desired voltage, and m capacitors are put in parallel to reach the desired capacity. As many components, a module may physically include one or several IGBT modules and a capacitor bank of n×m capacitors.

According to an exemplary embodiment of the present disclosure, the at least one electric capacitor is arranged between the inlet and at least one of the first face of the condenser and a planar shaped second face of the evaporator.

In other words, the thermosiphon cooling the electric and/or electronic components, such as IGBT modules, may be located downstream the capacitors, which means that the cooling air is cooler when cooling the capacitors than when cooling the IGBTs. Such an arrangement may be advantageous as the capacitors must be kept particularly cool to reach a long life of, for example, 30 years, especially if they are of an electrolytic type. Electrolytic capacitors may be utilized because of their low cost and high power density. Furthermore, a large portion of the losses may be caused by the IGBTs and only a small portion of the losses may be caused by the capacitors. This means that the cooling air entering the condenser is only slightly pre-heated by the capacitors. If the capacitors would be downstream the condenser, the cooling air would be strongly pre-heated when arriving at the capacitors resulting in a reduced lifetime.

If a most efficient heat removal from the second heat load generated by the capacitors and the first heat load generated by the electric and/or electronic components such as IGBTs in an operating state of the module is desired, the subject may be achieved by arranging the electric capacitor between the inlet and the condenser or the evaporator, as the electric components at the evaporator generate a larger amount of heat than the capacitors in an operating state of the module, such that the cooling air first passing the capacitors only takes up a lower amount of heat and still may remove the larger amount of heat of the electric and/or electronic components by passing through the condenser of the thermosiphon cooler inside the module.

According to an exemplary embodiment of the present disclosure, the at least one electric capacitor includes a first capacitor being arranged at least partially between the inlet and the condenser, and includes a second capacitor being arranged at least partially between the condenser and the outlet.

If it is desired that the cooling of the capacitors and the electric and/or electronic components is efficient, a module may be provided wherein the at least one electric capacitor includes a first capacitor being arranged at least partially between the inlet and the condenser and includes a second capacitor being arranged at least partially between the condenser and the outlet. Hence, the cooling air is cooler when cooling the capacitors between the inlet and the condenser than when cooling the electric and/or electronic components, but less cool than cooling the electric and/or components when cooling the second capacitors arranged between the outlet and the condenser.

According to an exemplary embodiment of the present disclosure, the at least one electric capacitor includes an elongated capacitor body extending in a vertical direction of the module, the vertical direction being transverse to a lateral direction and a horizontal direction of the module, and the lateral direction being transverse to the horizontal direction.

According to an exemplary embodiment of the present disclosure, the at least one electric capacitor includes an elongated capacitor body extending in a horizontal direction of the module, the horizontal direction being transverse to a lateral direction and a vertical direction of the module, and the lateral direction being transverse to the vertical direction.

According to an exemplary embodiment of the present disclosure, the at least one electric capacitor has a cylindrical capacitor body with a bottom face and a top face, the cylindrical capacitor body extending from the bottom face to the top face in a vertical direction or in a horizontal direction of the module, and the vertical direction being transverse to the lateral direction.

A plurality of layers of several capacitors extending or orientated in the vertical direction or a plurality of layer of several capacitors extending or orientated in the horizontal direction may be arranged in the module.

If an economic and efficient removal of the second heat load generated by the capacitors in an operating state of the capacitors is desired, this object may be achieved by providing capacitors with a cylindrical capacitor body or an elongated capacitor body which are arranged such that a cooling airflow is flowing transverse to the cylindrical capacitor body extending in the vertical direction or the horizontal direction.

According to an exemplary embodiment of the present disclosure, the at least one further electric and/or electronic component is thermally connected to a planar shaped third face of the evaporator opposite a planar shaped second face of the evaporator.

If it is desired to provide for a compact and room saving arrangement of further electric and/or electronic components at the evaporator inside the module while enabling an efficient and economic cooling, this object may be achieved by thermally connecting at least one further electric and/or electronic component to a planar shaped third face of the evaporator opposite a planar shaped second face of the evaporator to which the at least one electric and/or electronic component is thermally connected.

According to an exemplary embodiment of the present disclosure, the module includes at least one first fan being arranged at at least one of the inlet and the outlet.

By providing such a first fan, the efficiency of cooling of the module or the electric and/or electronic system by an airflow may be improved, as more air or cooling air per time may pass through the module compared with a module without a fan.

According to an embodiment of the disclosure, an electric and/or electronic system with a cabinet is provided. The cabinet includes at least two modules according to anyone of the preceding and following aspects and embodiments as well as a cabinet housing including a first aperture for receiving a stream of cooling air, and comprising a second aperture for releasing the cooling air thereafter in an operating state of the cabinet. The at least two modules are arranged in the cabinet housing such that a major portion of cooling air flowing through the first aperture of the cabinet housing is divided into partial streams of cooling air, at least some of the partial streams being enabled by the guiding structure to flow into their dedicated module via the inlet through the dedicated module to the outlet of the dedicated module respectively such that at least two of the partial streams of cooling air are connected in parallel to one another and thereafter leave the cabinet together through the second aperture of the cabinet housing in an operating state of the cabinet.

As used herein, the term majority may be understood to mean an amount of more than 50%. The module may be a power module. The module may be a unit cell. The cabinet may be a rack. The thermosiphon cooler may be two-phase cooler, wherein the evaporator and the condenser form a loop-type thermosiphon comprising a coolant which at least partially changes phases between a liquid state and a vaporous state in an operating state of the module when the coolant is heated up above a vaporization point of the coolant. The condenser may have at least one first conduit extending in a direction that extends transverse to a working direction of earth gravity in an operating state of the module, and a center of gravity of the coolant in the liquid state may be located below the at least one first conduit of the condenser in an operating state of the module.

In other words, an electric and/or electronic system with a cabinet is provided, wherein cooling air is sucked in through a front cabinet side through the first aperture and through a module door or an inlet of each module, which may contain a filter next to a protecting inlet grill, wherein the cooling air is then sucked through each module and out of the module outlet, and then upwards, towards a top cabinet side, were a fan may be located. Such an airflow arrangement yields a very short airflow path, and is space saving. Thus, electric and/or electronic components such as IGBT modules and capacitors of each module may be sufficiently cooled to limit component temperatures and to reach the desired lifetime.

The electric and/or electronic system with a cabinet as mentioned above enables for a simple and economic way of cooling the modules in the cabinet. The modules may comprise IGBTs and capacitors, wherein the IGBTs may have a significant loss density, requiring high cooling power. The use of a thermosiphon cooler in the modules for cooling the IGBTs enables to achieve a high cooling power, for example similar to water cooling, wherein thermosiphons are built without pumps and are hence cheaper and may involve no servicing. In the thermosiphon cooler, the heat may be transferred from the electric and/or electronic component such as the IGBT and/or capacitor(s) inside the module to the evaporator, then transported by a two phase fluid from the evaporator to the condenser, and further passed from the condenser to a channel inside the cabinet and from there after passing the second aperture of the cabinet to the ambient air. The condenser must be located above the evaporator, such that buoyancy can drive the flow within the thermosiphon. The cooling airflow within a module is provided from the inlet at the front module side through the module to the outlet at the back module side.

In an operating state of the cabinet the cooling air may flow through a top part of the module, wherein capacitors are arranged at the top part in the airflow as well as the condenser of the thermosiphon, and the electric and/or electronic component(s) such as IGBTs are arranged at the bottom part of the module together with the evaporator which cools the component(s) being outside the cooling airflow. Thus the cooling airflow may not be disturbed by the evaporator and may efficiently cool the capacitors and the condenser. Since most of the bottom part of the module is empty the module compactness and the cabinet compactness may be limited or reduced.

The module compactness and cabinet compactness may be improved by using the total module height to accommodate the capacitors, thereby enabling that the module may be less wide or less deep compared to an arrangement of capacitors only in the top part of the module and thus reducing the module volume and increasing the compactness for the same number of capacitors.

A projection of the at least two modules may be arranged on a rear face in a plane defined by a vertical direction and a horizontal direction of the cabinet, the vertical direction being transverse to the horizontal direction. The projection is to be understood as a pattern of the at least two modules on the projecting plane defined by a vertical direction and a horizontal direction of the cabinet. Hence, the at least two modules may be displaced to one another in the direction of the horizontal direction without deviating from the gist of the present disclosure. The cooling air may flow in a direction transverse to the plane in an operating state of the cabinet.

If a compact and efficient cooling inside a cabinet with at least two modules is desired, this object may be achieved by providing such an electric and/or system wherein the at least two modules are arranged in a plane and the cooling air flows traverse to the plane or against the plane, such that a major portion, for example more than 50% of cooling air may pass through the modules from the front of each module through the module and to the back of each module via the outlet and by air convection to the second aperture of the cabinet and to the ambient.

According to an exemplary embodiment of the present disclosure, the at least two modules are arranged on top of one another along a vertical direction of the cabinet, wherein the cooling air flows in a direction transverse to the vertical direction of the cabinet in an operating state of the cabinet.

If it is desired to achieve a compact electric and/or electronic system with a cabinet which may be efficiently cooled, this may be achieved by arranging the at least two modules on top of one another along a vertical direction inside the cabinet and such that a cooling air flowing through the first aperture of the cabinet is flowing against the modules in a direction transverse to the vertical direction, such that a major portion of the cooling air is flowing through each of the modules. Thus the modules may be arranged in a room saving way inside the cabinet housing while at the same time providing for a major portion of cooling air flowing through the first aperture is flowing through each module. If desired, additional modules may be added on top of one another to increase the performance of the cabinet while providing for an efficient cooling of each of the modules.

According to an exemplary embodiment of the present disclosure, the at least two modules are arranged side-by-side of one another along a horizontal direction of the cabinet, the vertical direction being transverse to the horizontal direction, wherein the cooling air flows in a direction transverse to the horizontal direction of the cabinet in an operating state of the cabinet.

By providing such an arrangement of the modules inside the cabinet it may be achieved, that the cooling air flowing through the inlet of the cabinet may efficiently cool each of the modules and at the same time achieving a compact arrangement of the modules inside the cabinet.

If it is desired to have a flexible arrangement of the modules inside the cabinet while providing economic cooling, the at least two modules may be arranged side-by-side of one another along a lateral direction of the cabinet, wherein the lateral direction is transverse to the vertical direction and the horizontal direction, wherein the cooling air flows in a direction transverse to the lateral direction of the cabinet in an operating state of the cabinet.

The at least two modules may be arranged in the cabinet housing in matrix form with at least one module row and at least one module column.

By providing such an arrangement of the at least two modules inside the cabinet housing, a flexible electric and electronic system with a plurality of modules is provided, wherein each module is easily exchangeable from the cabinet and by using the space inside the cabinet in an optimal manner while at the same time providing an efficient and economic cooling of each of the modules comprising electric and/or electronic components. Thus, a flexible and economic customer-specific configuration and servicing of the cabinet may be provided.

If it is desired to further optimize the use of space inside the cabinet and stack as many modules as possible inside the cabinet the matrix may be a rectangular matrix with at least one module row extending in a horizontal direction of the cabinet and at least one module column extending in a vertical direction of the cabinet, the vertical direction being transverse to the horizontal direction.

According to an exemplary embodiment of the present disclosure, the cabinet further includes at least one module block including at least one module (in embodiments at least two modules) of the at least two modules, and a module block enclosure. The at least two modules are electrically connectable via a connector from at least one of inside or outside the module block or from inside the module block such that a total number of module block connectors may remain constant, independently from the number of modules inside the module block. The module block enclosure includes a first port for receiving the stream of cooling air, the module block enclosure for guiding the cooling air to the inlet of each of the modules, and wherein the module block enclosure includes a second port for releasing the cooling air thereafter in an operating state of the cabinet. The module block may be a converter module.

In other words, the at least two modules may be stacked in a module block which includes a first port to let in cooling air and a second port to let out cooling air after the cooling air has passed through the inlet of each module, through the module and to the outlet of each module in an operating state of the cabinet.

By providing such a module block it may be achieved, that a desired number of modules to be arranged in the cabinet may be faster inserted inside the cabinet by combining at least two modules in a module block, while at the same time providing the necessary efficient cooling.

The module block may also comprise only one module which may enable to exclusively provide module blocks in the cabinet housing also if an uneven number of modules is provided in the cabinet housing.

As a module block may also contain only a single module it may be achieved, that for example, in case, where a certain specific number of modules is needed for the electric and/or electronic system within the cabinet which would involve an extra module block with only one module, a cabinet housing including exclusively module blocks may be provided.

According to an exemplary embodiment of the present disclosure, the at least one module block together with the at least two modules is insertable and deployable in a drawer-like manner in and out of the cabinet. For that purpose, the at least two modules have a first guiding means each, and the cabinet has a second guiding means. The first guiding means and the second guiding means are formed such that the at least one module block and the at least two modules can be pulled into the cabinet and out of the cabinet like a rack.

If it is desired to achieve a simple, flexible and efficient exchange of a plurality of modules from the cabinet, for example for maintenance of the modules or the module block(s), this object may be achieved by such an electric and/or electronic system wherein the at least one module block is insertable and deployable in a drawer-like manner in and out of the cabinet.

According to an exemplary embodiment of the present disclosure, the at least one module block is arranged in the cabinet housing in matrix form with at least one module block row and at least one module block column.

By providing such arrangement of the module blocks inside the cabinet housing, a compact stacking of module blocks inside the cabinet housing may be achieved, while at the same time providing for an efficient and economic cooling.

If it is desired to provide for a flexible, compact and modular arrangement of the module blocks inside the cabinet housing the matrix may be a rectangular matrix with the at least one module block row extending in a horizontal direction of the cabinet and the at least one module block column extending in a vertical direction of the cabinet, the vertical direction being transverse to the horizontal direction.

According to an exemplary embodiment of the present disclosure, the module block includes at least one second fan being arranged at at least one of the first port and the inlet of at least one of the at least two modules, and the second port and the outlet of at least one of the at least two modules.

In other words, the second fan may be arranged either at the first port, at the inlet of at least one of the at least two modules, at the second port, or at the outlet of the at least one of the at least two modules or at the first port and the inlet or at the second port and the outlet, or at the first port and the outlet, or at the second port and the inlet, or at the first port and the second port, or at the inlet and the outlet.

If it is desired to achieve an more efficient cooling of the electric and/or electronic system with a cabinet by for example increasing the amount and velocity of cooling air flowing through each module, this object may be achieved by providing such a second fan.

The cabinet may further comprise at least one third fan arranged at at least one of the first aperture and the second aperture.

By providing such a third fan at the first aperture and the second aperture it may be achieved that the cooling of the cabinet by cooling air may be enhanced by providing a higher amount of cooling air per time flowing through the cabinet, the module block, and the modules, respectively.

The above-mentioned embodiments and aspects advantageously provide for a gravity driven thermosiphon inside each module, wherein no pulsating thermosiphon may be needed. A large airflow cross-section through each module may be provided such that only a small pressure drop results in an operating state of the module of the cabinet. An efficient usage of the space in the module and hence a high compactness also in the cabinet may be provided. The electric and/or electronic system according to the above-mentioned aspects and embodiments with the various arrangements of the modules or module blocks inside the cabinet may allow for scaling the power of a module with impact on the form factor in height direction (vertical direction) only and proportional to the extra space requirement for possibly added capacitors. Thus, power scaling of a module may be achieved by extending the evaporator length in the lateral direction within an existing space of a module to accommodate additional electric and/or electronic components such as IGBT modules, and by extending the condenser in the vertical direction, increasing the height of the module, to account for higher cooling needs. The extra height of the module is used and needed for the additional module capacitors. Depth (extending in the horizontal direction), width (extending in the lateral direction) and basic design of the module may remain the same. The above-mentioned arrangements possibilities of the modules inside the cabinet are suitable for example for modular multi-level converters, wherein the modules are converter modules.

By the way, the term 'electronic component' is understood in the context of this disclosure as a power electronic component, which is used for diodes, thyristors and other semiconductor elements whose block-voltage is more than 500 Volts such that can be used in a power module, e.g. for a drive or converter for supplying a mill or a vehicle with energy.

In any of the above-mentioned embodiments, it is advantageous if the evaporator has several first conduits. If each of these first conduits has the same outer cross-section it is more advantageous to manufacture the evaporator than where the first conduits are of different outer cross-section. Particularly advantageous evaporators in terms of complexity are achievable if the whole cross-section of the first conduits is identical. If all the first conduits have substantially the same length extending in a direction of a longitudinal axis defined by their tubular shape each it is possible to manufacture the evaporator most economically because the conduits are identic to one another.

For ensuring an optimal thermal transfer from the electric and/or electronic component to the first conduits it is advantageous if the evaporator includes a heat transfer element having a mounting surface for providing a suitable planar mounting surface to which the electric and/or electronic component is thermally connectable. The heat transfer element is mechanically and thermally connected to the plurality of first conduits. The planar second face forming the mounting surface for the electric and/or electronic component is provided on the heat transfer element. On the opposite side of the mounting surface a plurality of grooves is provided for receiving a first conduit each. The shape of the grooves is chosen to match the shape of the exterior wall of the first conduit when seen in the cross-section such in order to provide for an optimal thermal transfer from the electric and/or electronic component to the first conduits. The plurality of grooves confers the heat transfer element with a comb-like cross-section when seen in the lateral direction in which the first conduits extend. The heat transfer element may be made of a high thermally conductive material comprising aluminium and/or copper. If the mounting space on the mounting surface is too narrow because there are too many electric and/or electronic component need to be thermally connected to the evaporator two heat transfer elements with a comb-like cross-sections may be chosen to be attached opposite one another such that an additional mounting surface is provided by the additional heat transfer element provided that the evaporator can handle the thermal transfer to the condenser satisfactory. This way, particularly compact modules (power modules) in turns of overall dimensions are achievable. An additional effect of using such heat transfer elements resides in that it can serve as a gauge at the time of assembling the first conduits before connecting them to a mechanically solid structure, e.g. by one-shot brazing. By the way, one shot brazing, stacking and assembly of all elements of the heat-exchanger core can be done in a fully automated way.

In any of the above-mentioned embodiments, it is advantageous if the condenser has several second conduits, too. If each of these second conduits has the same outer cross-section it is more advantageous to manufacture the condenser than where the second conduits are of different outer cross-section. Particularly advantageous condensers in terms of complexity are achievable if the whole cross-section of the second conduits is identical. If all the second conduits have the same length extending in a direction of a longitudinal axis defined by their tubular shape each it is possible to manufacture the evaporator most economically because the conduits are identic to one another.

Employing at least the very same kind and type of profiles for manufacturing the first conduits and the second conduits is further advantageous as it simplifies the manufacturing process even more. The profiles may be semi-finished products, such as extruded aluminium profiles, for example.

As to the orientation of the first conduits it is advantageous to arrange them in the evaporator such that they run essentially parallel to one another when seen in a cross-section through the evaporator for the following reasons:

First, conduits having substantially flat shell surface portions allow for easier mechanical attachment to the heat transfer element than conduits having a circular cross-section. Expressed in simple terms, conduits having substantially flat shell surface portions ease the assembling process of the conduits and the manifolds and/or the heat transfer element;

Second, conduits having substantially flat shell surface portions allow for thermally attaching the power electronic component or additional such components to be cooled to be cooled more directly than conduits having a circular cross-section because the contact surface is larger.

As to the orientation of the second conduits it is advantageous to arrange the plurality of second conduits in the condenser also such that they run essentially parallel to one another when seen in a cross-section through the condenser for the following reasons:

First, the pressure drop of the stream of air can be kept minimal provided that the elongated, e.g. oblong cross-section of the second conduits extend parallel to the flow direction of the stream of air through the condenser;

Conduits having a substantially flat shell surface portions allow for easier mechanical attachment to the neighbouring manifolds for connection than conduits having a circular cross-section.

For several reasons it is advantageous to use flat, multi-port tubes for the first conduits and the second conduits. This holds particularly true if the multi-ports are arranged in a common plane. Such flat tubes, i.e. profiles having an oblong outer cross-section introduce less pressure drop to the air flow compared to tubes/pipes having a common cylindrical round outer cross section. Multi-port profiles are also known as MPE-profiles which are known as low-cost standard extruded aluminium-based profiles in the field of automotive coolers. The multi-port design of the conduits is advantageous in that it increases the internal heat-transfer surface due to its higher wetted surface being in contact with the working fluid compared to common pipe or profile having one single opening or channel only. Moreover it is ideal for promoting a bubble-pumping effect and for its pressure resistance to higher (interior) vapour pressure compared to channels having a comparatively large cross-section. Moreover, the plurality of sub-channels of the multi-port profiles supports the convection boiling effect to a maximal extent.

Basic thermosiphon coolers of a particular low mechanical complexity are achievable if the evaporator profiles, i.e. the first conduits, extend parallel to the tilt axis.

Where the motion of the coolant shall be provided by gravity in an operating state of the heat exchanger it is advantageous to design and arrange the heat exchanger such in the three-dimensional space that the second conduits extend in the direction of the working direction of earth gravity at least partly. Depending on the embodiment, the condenser profiles may extend transverse to the tilt axis in cases where the evaporator extends in the horizontal direction.

Especially in embodiments of a thermosiphon heat exchanger that provides for the coolant motion to have a given flow direction, it is possible to define a natural check-valve behaviour of the coolant in an undesired direction by dimensioning parts of the heat exchangers asymmetrically, for example dimensioning a cross-section of the vapour riser manifold to be larger than a cross-section of the condensate return manifold. In embodiments of the heat exchanger where several first conduits and/or several second conduits are fluidly connected at their one end to a manifold, it is advantageous if the manifold has a round, tubular cross-section, wherein orifices for receiving the conduits are brought in. Owing to the circular interior cross-section of the manifold, the linear conduit elements can just be cut off the extruded profile and inserted into the orifice each. By doing so, the interior wall of the manifold will form a natural block for the linear conduit elements in that it jams with the lateral edges of the conduits during insertion such that the inserted linear conduit will not cut off the interior space in the manifold. Experiments have shown that excellent thermal performances are achievable if the overall cross-area of one linear conduit measures just about 5 to 10 percent of the overall interior cross-section of the manifold.

The following two characteristics contribute substantially to the compactness of the module and to a higher entity fitted with such a module accordingly.

Firstly, the first conduits include a cross-section that may be made quite flat, for example, of rectangular or of oblong cross section that fits into the orifices of the heat transfer element such that the first conduits do not or do merely slightly protrude a maximum thickness of the heat transfer element. Thus, a maximum thickness of the heat transfer element forms the main factor of the overall evaporator thickness measured in a direction perpendicularly to the planar second face of the evaporator, wherein the second face of the evaporator is formed by the thermal mounting surface for the electric/electronic component on the back side of the heat transfer element. Particularly in embodiments where the second and third manifolds have a diameter that is smaller or maximally as large as the thickness of the heat transfer element, and provided that the manifolds are arranged aside the heat transfer element such that they are not displaced in the second main normal direction relative to the heat transfer element, it is the heat transfer element that is responsible for the minimal evaporator thickness at last.

In other words, the first conduits are shaped and oriented such in the evaporator that the evaporator has a slab-like panel-shaped overall appearance, wherein a maximum thickness of the evaporator extending in the second main normal direction running perpendicularly to the planar second face of the evaporator is smaller than a maximum overall width of the evaporator extending in a lateral direction perpendicularly to the second main normal direction in the second face of the evaporator such that a maximum-thickness-to-maximal-width-ratio confers a flat, plate-like overall appearance on the evaporator.

Depending on the demands on the compactness and the thermal transfer capacity the maximum thickness of the evaporator measures less than 50% of the maximum overall width of the evaporator, for example, even less than 30% of the maximum overall width of the evaporator, such as even less than 20% of the maximum overall with of the evaporator. Expressed differently, the maximum-thickness-to-maximal-width-ratio of the evaporator is in a range of about 1:2 to about 1:a, wherein a is at least 5, for example, at least 10.

The term "width of the evaporator" is understood as a maximal dimension defined either by a length of the first conduits plus the thickness of the second manifold plus the thickness of the third manifold extending in the horizontal direction, for example, the depth of the module; or by an overall dimension of the plurality of first conduits extending in the lateral direction, for example, the width of the module.

For maintaining the basic functionality of a heat transfer means from the electric/electronic component to the phase-changing coolant within the thermosiphon the number of first conduits has to be kept in a certain range depending on the maximum thickness of the evaporator. To give an illustrative example for a given amount of a heat flow, the maximum thickness of a first embodiment of an evaporator can be kept lower if there are many first conduits compared to the maximum thickness of a second embodiment of an evaporator having fewer first conduits.

Since there will be a minimum mounting space utilized for thermally connecting the electric/electronic component to the evaporator a certain minimal first threshold in terms of area and width of the evaporator is set. Since the electric/electronic component and other equipment (e.g. capacitors) to be cooled and/or merely to be arranged in the space delimited by the condenser and the evaporator on one side and provided that an overall thickness of the module in the second main normal direction shall not exceed the maximal width of the condenser a minimal second threshold extending between the second face of the evaporator and a distal end of the condenser is set. The smaller the minimal second threshold is, the larger the maximum thickness of the evaporator can be.

Secondly, the second conduits include a cross-section that may be quite flat, for example, of rectangular or of oblong cross section that fits into the orifices of the heat transfer element, such that the second conduits do not or do merely slightly protrude a maximum thickness (of a virtual shell surface) of the condenser. Thus, the maximum extension in cross-section of the second conduits forms the main factor of the overall condenser thickness measured in a direction perpendicularly to the planar first face of the condenser, wherein the first face of the condenser is extending transverse to the second face of the evaporator due to the tilt arrangement. Particularly in embodiments where the first and fifth manifolds have a diameter that is smaller or maximally as large as the maximum extension in cross-section of the second conduits, and provided that the manifolds are arranged aside the set of second conduits such that they are not displaced in the first main normal direction relative to the second conduits, it is the second conduits that are responsible for the minimal condenser thickness at last.

In other words, the second conduits are shaped and oriented such in the condenser that the condenser has a slab-like panel-shaped overall appearance, wherein a maximum thickness of the condenser extending in the first main normal direction running perpendicularly to the first face of the condenser is smaller than a maximum overall width of the condenser extending in a lateral direction perpendicularly to the first main direction in the second face of the condenser such that a maximum-thickness-to-maximal-width-ratio confers a flat, plate-like overall appearance on the condenser. Expressed differently, the maximum-thickness-to-maximal-width-ratio of the condenser is in a range of about 1:2 to about 1:b, wherein b is at least 5, for example, at least 10.

Depending on the demands on the compactness and the thermal transfer capacity, the maximum thickness of the condenser measures less than 50% of the maximum overall width of the condenser, for example, even less than 30% of the maximum overall width of the condenser, such as even less than 20% of the maximum overall with of the condenser.

The term "width of the condenser" is understood as a maximal dimension defined either by a length of the second conduits plus the thickness of the first manifold plus the thickness of the fifth manifold extending in the vertical direction, for example, the height of the module; or by an overall dimension of the plurality of second conduits extending in the horizontal direction, for example, the depth of the module. The above mentioned directions change in embodiments where the orientation of the second conduits is rotated with respect to lateral direction axis accordingly.

For maintaining the basic functionality of a heat transfer means from the phase-changing coolant within the thermosiphon to the stream of cooling air once the heat exchanger is in use, the number of second conduits may be kept in a certain range depending on the maximum thickness of the condenser. To give an illustrative example for a given amount of a heat flow, the maximum thickness of a first embodiment of a condenser can be kept lower if there are many second conduits compared to the maximum thickness of a second embodiment of a condenser having fewer second conduits.

Again, since there will be a minimum mounting space utilized for thermally connecting the electric/electronic component to the evaporator, a certain minimal first threshold in terms of area and width of the evaporator is set. Since the electric/electronic component and other equipment (e.g. capacitors) to be cooled and/or merely to be arranged in the space delimited by the condenser and the evaporator on one side and provided that an overall length of the module in the first main normal direction shall not exceed the maximal width of the evaporator a minimal third threshold extending between the first face of the condenser and a distal end of the evaporator is set. The smaller the minimal third threshold is, the larger the maximum thickness of the condenser can be.

Particularly in embodiments of a system where the stream of cooling air is comparatively weak, e.g. due to natural convection cooling, it is crucially important that a pressure drop over the condenser is small because the condenser might hamper or even block the stream of cooling air from entering the condenser through the spaces in the grill-like condenser. But also in systems where the stream of cooling air is formed by forced convection, it is still very important that the pressure drop over the condenser is small. The reason resides in that the smaller the pressure drop is, the weaker a fan can be for establishing a sufficient stream of air. The weaker the fan, the smaller it commonly is in turns of dimensions and the less expensive it is. So, smaller fans contribute to compact systems. Moreover, smaller fans are advantageous compared to larger fans because they are less noisy and consume less energy when in use.

According to an exemplary embodiment of the present disclosure, a thermosiphon cooler for removing heat from an at least one electric and/or electronic heat source may be provided inside the module comprising a condenser and an evaporator with first conduits which are fluidly connected to the second conduits of the condenser. The condenser includes a planar-shaped first face with a first main normal direction. The evaporator includes a planar-shaped second face with a second main normal direction for thermally connecting to the at least one heat source. The evaporator is arranged at at least one of a first position extending parallel offset to the condenser, and a second position angular to the condenser with an angle of greater than 30° and less than 150° between a first main normal direction and the second main normal direction.

The angle may be selected from the group consisting of an angle of 90°, an angle of essentially 90°, an acute angle, an obtuse angle, and an angle region of 85°-95°, 60°-120°, 45°-135°, 60°-90°, 90°-120°, 45°-90°, 90°-135°, greater than 0-45°, 135° to less than 180°. The second conduit of the condensers may be formed such that a coolant motion is provided by gravity in an operating state of the heat exchanger.

According to an exemplary embodiment of the present disclosure, the first face of the condenser is arranged in a first plane defined by a vertical direction and a horizontal direction of the thermosiphon cooler, the horizontal direction being transverse to the vertical direction and transverse to a lateral direction of the thermosiphon cooler. The second position of the evaporator is angled about the horizontal direction by the angle. Particularly compact modules are achievable if the angle is about 90 degrees.

According to an exemplary embodiment of the present disclosure, the first face of the condenser is arranged in a first plane defined by a vertical direction and a horizontal direction of the thermosiphon cooler, the horizontal direction being transverse to the vertical direction and transverse to a lateral direction of the thermosiphon cooler. At the second position the evaporator is angled about the vertical direction by the angle.

If the size of a module/power module in turns of overall dimensions is limited in one direction but the thermal capacity of the evaporator and/or of the condenser utilizes a thermal transfer rate that would exceed the feasible maximum thermal transfer rate of one basic evaporator and/or condenser disclosed herein, the evaporator and/or the condenser may be designed to include more than one first set of first conduits or one second set of second conduits each and that the sets to be stacked such as disclosed in EP2246654A1, for example, the disclosure of which is incorporated herein by reference in its entirety.

These and other aspects of the present disclosure will become apparent from and elucidated with reference to the exemplary embodiments described hereinafter.

FIG. 1 schematically shows a module 102 including two switches 202 and one capacitor 204. The module 102 may be a modular multi-level converter (MMLC) or a modular two-level converter (M2LC), and the switches 202 may be IGBT modules. The module 102 may be a box-type element that may be inserted in a rack or cabinet like a drawer. In the cabinet, many modules may be arranged in rows and columns.

FIG. 2 schematically shows an electric and/or electronic system 200 with a cabinet 400 that includes a cabinet housing 406 with a first aperture (502, not shown, see FIG. 3) for receiving a stream of cooling air, and including a second aperture (520, not shown, see FIG. 3) for releasing the cooling air thereafter in an operating state of the cabinet 400. At least two modules 102, each include a guiding structure (615, not shown, see FIG. 4, FIG. 7) with an inlet and an outlet. The at least two modules 102 are arranged in the cabinet housing 406 such that a major portion of cooling air flowing through the first aperture of the cabinet housing 406 is enabled to flow into each module 102 via the inlet guided by the guiding structure through each module 102 to the outlet and thereafter to the second aperture of the cabinet housing 406 in an operating state of the cabinet 400. At least two of the at least two modules 102 each include a thermosiphon cooler (600, not shown, see FIG. 4, FIG. 16, for example) which includes an evaporator for receiving a first heat load generated by at least one electric and/or electronic component (202, see FIG. 1, 610, see FIGS. 4, 7 and 16) of each module 102 in an operating state of each module 102, and which thermosiphon cooler includes a condenser for transferring a majority of the first heat load to the cooling air in an operating state of the cabinet 400.

The modules 102 are arranged in a plane defined by a vertical direction 634 and a horizontal direction 632 of the cabinet 400, the vertical direction 634 being transverse to the horizontal direction 632. The cooling air flows in a direction transverse to the plane in an operating state of the cabinet. The at least two modules 102 are arranged on top of one another along a vertical direction 634 of the cabinet 400 and the cooling air flows in a direction transverse to the vertical direction 634 of the cabinet 400 in an operating state of the cabinet 400. The at least two modules 102 are arranged side-by-side of one another along a horizontal direction 632 of the cabinet 400, the vertical direction 634 being transverse to the horizontal direction 632. The cooling air flows in a direction transverse to the horizontal direction 632 of the cabinet 400 in an operating state of the cabinet.

The at least two modules 102 may be arranged side-by-side of one another along a lateral direction 630 of the cabinet 400, the lateral direction 630 being transverse to the vertical direction 634 and the horizontal direction 632. The cooling air may then flow in a direction transverse to the lateral direction 630 of the cabinet 400 in an operating state of the cabinet 400.

The at least two modules 102 are arranged in the cabinet housing 406 in matrix form with at least one module row and at least one module column. The matrix is a rectangular matrix with at least one module row extending in the horizontal direction 632 of the cabinet 400 and the at least one module column extending in the vertical direction 634 of the cabinet 400, the vertical direction 634 being transverse to the horizontal direction 632.

At least one module block 402 is provided to include at least two modules 102 of the at least two modules 102, and a module block enclosure 715. The at least two modules 102 are electrically connectable via a connector (1402, not shown, see FIG. 24) from outside or from inside the module block 402 such that the total number of electric module block connectors may remain constant, independently from the number of modules 102 inside the module block 402. The module block enclosure 715 includes a first port (508, not shown, see FIGS. 25 to 28) for receiving the stream of cooling air, the module block enclosure 715 for guiding the cooling air to the inlet of each of the modules 102. The module block enclosure 715 includes a second port (506, not shown, see FIGS. 25 to 28) for releasing the cooling air thereafter in an operating state of the cabinet 400. The module block enclosure 715 includes a left module block side 725 and a right module block side 723 extending in a vertical direction 634 as well as a bottom module block side 718 and a top module block side 717 extending in the horizontal direction 632.

Each module block 402 in FIG. 2 includes four modules 102 which are arranged side-by-side extending in the horizontal direction 632. The module blocks 402 are arranged in the cabinet housing 406 in matrix form along at least one module block row and at least one module block column, wherein the matrix is a rectangular matrix with at least one module block row extending in the horizontal direction 632 of the cabinet 400 and the at least one module block column extending in the vertical direction 634 of the cabinet 400. In particular, the module blocks 402 are arranged in a matrix with six module block rows and three module block columns. The module blocks 402 may be also arranged side-by-side extending in the lateral direction 630.

The cabinet housing 406 includes a left cabinet side 409 and a right cabinet side 411 extending in the vertical direction 634, and includes a bottom cabinet side 410 and a top cabinet side 408 extending in the horizontal direction 632. The cabinet 400 further includes a third fan 404 arranged at the top cabinet side 408 of the cabinet 400 which may be near the first aperture of the cabinet (see FIG. 3, for example).

FIG. 3 schematically shows a cross-sectional side view of the electric and/or electronic system 200 of FIG. 2. The first aperture 502 of the cabinet 400 is arranged at a front cabinet side 413 extending in the vertical direction 634 and the second aperture 520 of the cabinet housing 406 is arranged at the top cabinet side 408. A back cabinet side 412 is extending in the vertical direction 634, wherein the second aperture 520 may also be arranged at the back cabinet side 412 according to an exemplary embodiment of the present disclosure. The third fan 404 is arranged above the second aperture 520. Cooling air flows in a flow direction 510 through the first aperture 502 and from there a major portion of the cooling air is enabled to flow first through the first port 508 of the module block enclosure 715 and guided by the module block enclosure 715 to the inlet of each module 102 and from there through the second port 506 of the module block enclosure 715, the second port 506 for releasing the cooling air thereafter in an operating state of the cabinet 400. The released cooling air passes in a release flow direction 511 through a cabinet channel 512 towards the second aperture 520 of the cabinet, is sucked in by the third fan 404 and transported to the ambient 540 through third apertures 504, releasing the cooling air in an ambient flow direction 514 essentially directed in the lateral direction 630. The third fan 404 which enables a flow of cooling air from the first aperture 502 through the module blocks 406 and a major portion of the cooling air through each module 102 to the second aperture 520 may also be arranged at the first aperture 502 or at both the first aperture 502 and the second aperture 520. The first port 508 is arranged at front module block side 535 extending in the vertical direction 634, and the second port 506 is arranged at a back module block side 536 extending in the vertical direction 634.

Figure 4:
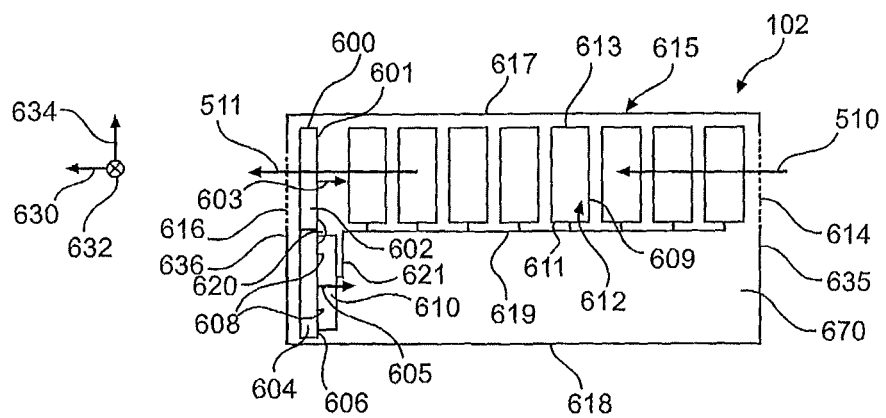
FIG. 4 schematically shows a cross-sectional side view of a module of an electric and/or electronic system with a thermosiphon cooler according to an exemplary embodiment of the present disclosure.

FIG. 4 shows a module 102 with a guiding structure 615 including an inlet 614 and an outlet enabling cooling air or another thermal carrier to flow in the flow direction 510 via the inlet 614 into the module 102 guided by the guiding structure 615 through each module 102 to the outlet 616. The released cooling air may then flow in the release flow direction 511 towards the second aperture of the cabinet housing in an operating state of the cabinet as shown in FIG. 2 and FIG. 3. The guiding structure 615 includes a guiding portion 619 which may be an electrical bus bar connecting each of a plurality of electric capacitors 612 via a connecting line 621 to an electric and/or electronic component 610 such as an IGBT. Each of the capacitors 612 has a cylindrical body 609 with a bottom face 611 and a top face 613, the cylindrical capacitor body 609 extending from the bottom face 611 to the top face 613 in a vertical direction 634 of the module 102, the vertical direction 634 being transverse to a lateral direction 630 and a horizontal direction 632 of the module 102, wherein the guiding portion 619 is extending in the lateral direction 630. The capacitor body 609 may be an elongated capacitor body without a cylindrical shape.

The electric and/or electronic component 610 is attached to an evaporator 604 of a thermosiphon cooler 600 by attachment devices 608 such as screws, for example. The thermosiphon cooler 600 further includes a condenser 602. The thermosiphon cooler 600 removes heat from the electric and/or electronic component 610 in an operating state of the module 102. The evaporator 604 receives a first heat load generated by the electric and/or electronic component 610 of each module 102 in an operating state of each module 102, and the condenser 602 transfers a majority of the first heat load to cooling air flowing in the flow direction 510 in an operating state of the module 102 and the cabinet. The condenser 602 includes a planar-shaped first face 601 with a first main normal direction 603 and the evaporator includes a planar-shaped second face 606 with a second main normal direction 605 for thermally connecting to the at least one electric and/or electronic component 610. The evaporator 604 is arranged at an angle 620 of 180° with respect to the condenser about a tilt axis 622. The angle between the first main normal direction 603 and the second main normal direction 605 is 0° as the main normal directions 603, 605 extend parallel to each other in the lateral direction 630.

The at least one electric capacitor 612 is electrically connected to the at least one electric and/or electronic component 610, and a majority of the second heat load generateable by the at least one electric capacitor 612 is removable by the cooling air via the outlet 616 in an operating state of the module 102 and the cabinet. The guiding structure 615 further includes a back module side 636 and a front module side 635 extending in the vertical direction 634 and including the outlet 616 and the inlet 614. The guiding structure 615 includes a bottom module side 618 and a top module side 617 extending in the lateral direction 630. The capacitors 612 are arranged parallel to each other and to the condenser 602 at a top part of the module 102 extending in a vertical direction 634 parallel to the inlet 614 and to the outlet 616 such that an incoming cooling airstream flowing in the flow direction 510 passes the capacitors 612 and flows thereafter through the condenser 602 to the outlet 616 in the lateral direction 630 without being deflected or distracted by the evaporator 604. The evaporator 604 and the electric and/or electronic component 610 also extend in the vertical direction 634 and are arranged below the condenser 602 and the capacitors 612 in a bottom part of the module 102 such that a module space 670 is present, which is not occupied by capacitors 612.

Figure 5:
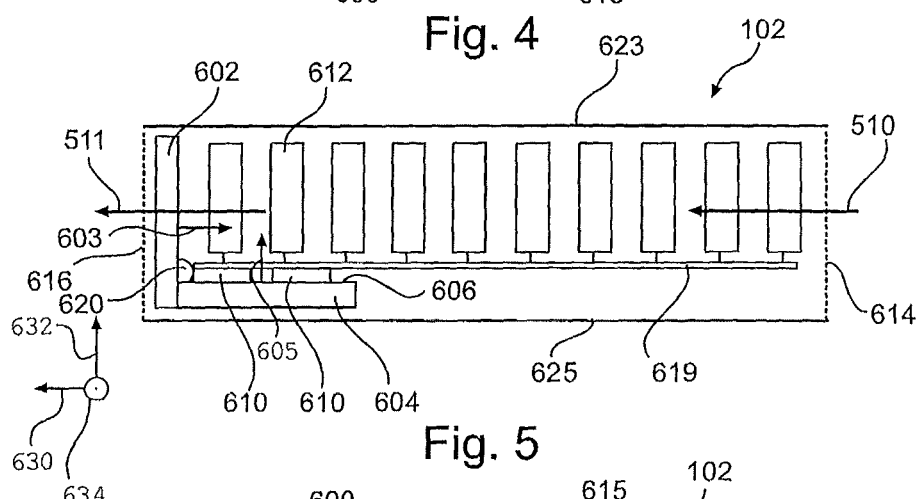
FIG. 5 schematically shows a cross-sectional side view of a module of an electric and/or electronic system with a thermosiphon cooler according to an exemplary embodiment of the present disclosure.

FIG. 5 schematically shows a cross-sectional view of a module 102 with similar components as the module shown in FIG. 4, wherein the evaporator 604 is tilted with respect to the condenser 602, the condenser 602 being arranged between the inlet 614 and the outlet 616 such that a major portion of cooling air flows in a flow direction 510 transverse to a planar-shaped first face 601 of the condenser 602 through the condenser 602 to transfer the majority of the first heat load generated by at least one electric and/or electronic component 610 in an operating state of the module 102 to the cooling air in an operating state of the module 102 and the cabinet, respectively. The evaporator 604 includes a planar-shaped second face 606 which is extending in the lateral direction 630 of the module 102, the lateral direction 630 being transverse to a vertical direction 634 and a horizontal direction 632 of the module 102. The capacitors 612 and the planar-shaped first face 601 of the condenser 602 are arranged in parallel and extend in the horizontal direction 632. The inlet 614 and the outlet 616 extend in the horizontal direction 632 as well. The guiding structure 615 of the module 102 includes a left module side 625 and a right module side 623.

The evaporator 604 is arranged angular to the condenser 602 with an angle 620 of approximately 90° between the first main normal direction 603 and the second main normal direction 605. The evaporator 604 is tilted or angled about the vertical direction 634 by the angle 620 about the tilt axis 622. The first face 601 of the condenser 602 is arranged in a first plane defined by the vertical direction 634 and the horizontal direction 632 of the thermosiphon cooler 600, the horizontal direction 632 being transverse to the vertical direction 634 and transverse to the lateral direction 630 of the module 102, and the thermosiphon cooler 600, respectively.

The angle 620 may be an angle of greater than 30° and less than 150°. The angle 620 may be selected from the group consisting of an angle of 90°, an acute angle, an obtuse angle, and an angle region of 85°-95°, 60°-120°, 45°-135°, 60°-90°, 90°-120°, 45°-90°, 90°-135°, greater than 0°-45°, 135° to less than 180°. A coolant motion between the condenser 602 and the evaporator 604 is provided by gravity in an operating state of the thermosiphon cooler 600. The guiding portion 619 is extending in the lateral direction 630 and electrically connecting the capacitors to the electric and/or electronic component 610.

The module 102 includes a guiding structure 615 with an inlet 614 for receiving a stream of cooling air and with an outlet 616 for releasing cooling air thereafter in an operating state of the module 102, the guiding structure 615 for guiding the cooling air through the inlet 614, from there to the module 102, and thereafter through the outlet 616 in an operating state of the module 102. The thermosiphon cooler 600 includes the evaporator 604 for receiving a first heat load generated by the at least one electric and/or electronic component 610 of the module 102 in an operating state of the module 102. The thermosiphon cooler 600 includes the condenser 602 for transferring a majority of the first heat load to the cooling air in an operating state of the module 102. A large cross-sectional area open to the airflow of cooling air may be achieved by providing such a module 102. The evaporator 604 may be arranged at a position offset to the condenser 602 according to a further embodiment of the disclosure. The at least one electric capacitor 612 is electrically connected to the at least one electric and/or electronic component 610 and a majority of a second heat load generateable by the at least one electric capacitor 612 is removable by the cooling air via the outlet 616 in an operating state of the module 102.

Figure 6:
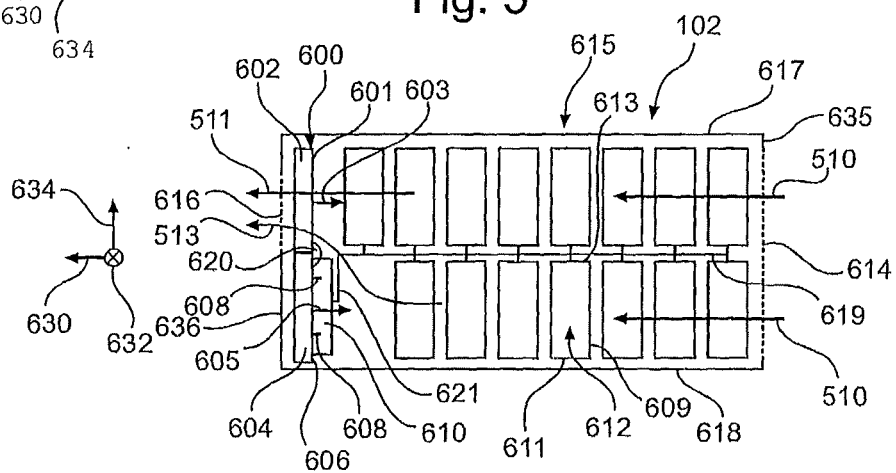
FIG. 6 schematically shows a cross-sectional side view of a module of an electric and/or electronic system with a thermosiphon cooler according to an exemplary embodiment of the present disclosure.

FIG. 6 schematically shows a cross-sectional view of a module 102 similar to the module of FIG. 4 with the difference, that a plurality of capacitors 612 are arranged in the module space 670 of FIG. 4 and that the inlet 614 is extending essentially along the whole front module side 635 in the vertical direction, such that cooling air may flow in a flow direction 510 in the lateral direction 630 passing the capacitors 612 in the upper region of the module next to the condenser 602 and passing the capacitors 612 next to the evaporator 604 in the lower region of the module 102 and resulting in a deflected flow direction 513 at the condenser 602 since the evaporator 604 blocks the air flow and all cooling air must exit through the condenser 602 and the outlet 616. This may lead to high air velocities and a high pressure drop over the condenser 602.

Figure 7:
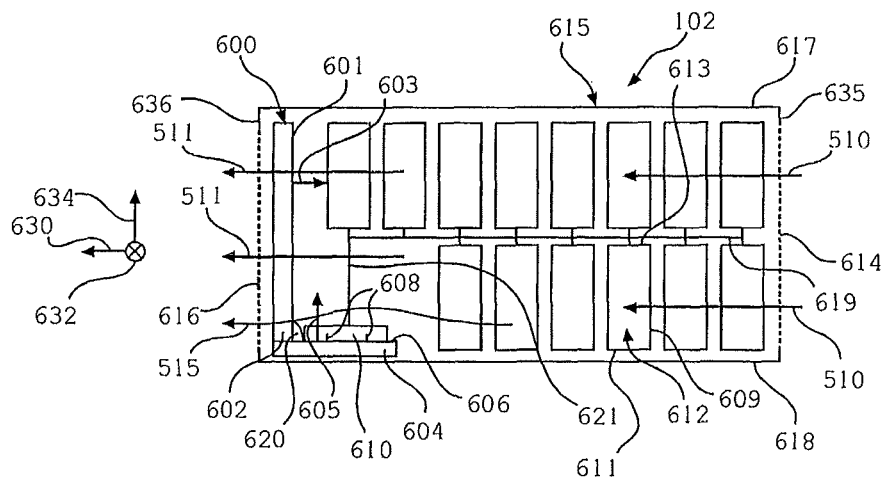
FIG. 7 schematically shows a cross-sectional side view of a module of an electric and/or electronic system with a thermosiphon cooler according to an exemplary embodiment of the present disclosure.

FIG. 7 schematically shows a module 102 with a similar arrangement of capacitors 612 compared to FIG. 6, wherein the evaporator 604 is tilted with respect to the condenser 602, and the condenser 602 is arranged between the inlet 614 and the outlet such that a major portion of the cooling air flows in a flow direction 510 transverse to a planar-shaped first face 601 of the condenser 602 to transfer the majority of the first heat load generated by the electric and/or electronic component 610 in an operating state of the module 102 to the cooling air in an operating state of the cabinet. The tilting of the evaporator 604 is similar to the tilting shown in FIG. 5, but with the difference, that the evaporator 604 is tilted or angled about the horizontal direction 632. Electric capacitors 612 are arranged in an upper part and in a lower part of the module 102 and are electrically connected via a guiding portion 619 to the at least one electric and/or electronic component 610. A majority of a second heat load generateable by the capacitor 612 is removable by the cooling air flowing in the flow direction 510 via the outlet 616 in an operating state of the module 102, and the cabinet 400, respectively. The first face 601 of the condenser 602 is arranged in a first plane defined by a vertical direction 634 and a horizontal direction 632 of the thermosiphon cooler 600. The horizontal direction 632 is transverse to the vertical direction 634 and transverse to a lateral direction 630 of the thermosiphon cooler 600 or the module 102. The evaporator 604 is angled about the horizontal direction 632 by an angle 620 of approximately 90° between the first main normal direction 603 and the second main normal direction 605 with respect to the condenser 602. Such a module 102 may enable an efficient cooling of capacitors 612 and an electric and/or electronic component 610 by providing a high compactness and by blocking as little of the airflow cross-section of the module 102 by the evaporator 604 by tilting the evaporator by 90°, such that a high pressure drop of the cooling air over the condenser may be omitted. The cooling air flows in the flow direction 510 and a slightly deflected flow direction 515 with a minimal pressure drop over the condenser 602.

Figure 8:
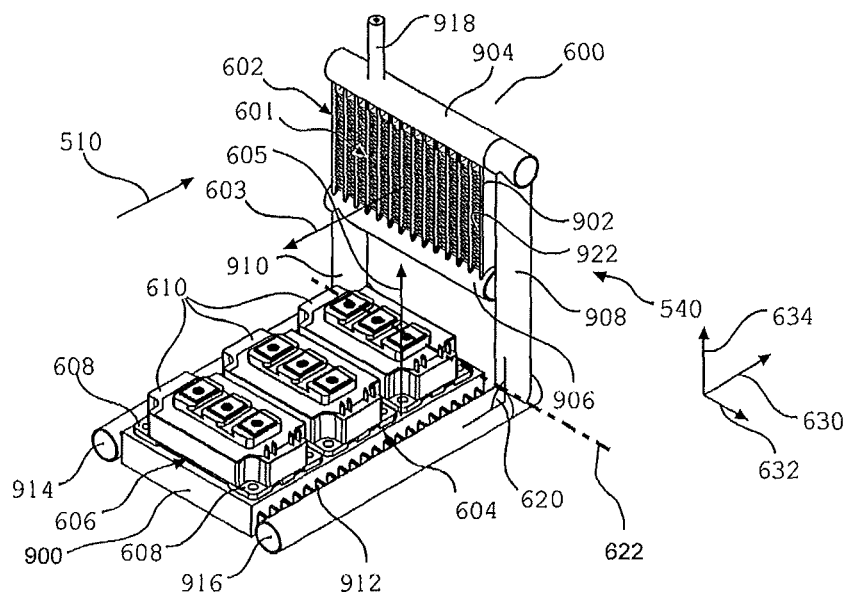
FIG. 8 schematically shows a perspective front view of a thermosiphon cooler according to an exemplary embodiment of the present disclosure.

FIG. 8 schematically shows a perspective front view of a thermosiphon cooler 600 according to FIG. 7 for removing heat from an at least one electric and/or electronic component 610 and from capacitors. The thermosiphon cooler 600 includes a condenser 602 and an evaporator 604 with a plurality of first conduits 912 which is fluidly connected to a plurality of second conduits 902 of the condenser 602. The plurality of first conduits 912 are mechanically connected and thermally contacted to a heat transfer element 900. This is achieved in that the heat transfer element 900 has a comb-like cross-section when seen in the lateral direction in which the first conduits 912 extend. The comb-like cross-section is conferred on the transfer element 900 by a plurality of grooves provided for receiving a section of a first conduit 912 each. The evaporator 604 is arranged at a first position offset to the condenser 602 and at the same time at a second position angular to the condenser 602 with an angle 620 of 90° between the first main normal direction 603 and the second main normal direction 605. The evaporator 604 is angled about the horizontal direction 632 by the angle 620. The thermosiphon cooler 600 includes a coolant for transferring heat from the evaporator 604 to the condenser 602. A first manifold 904 is fluidly connected to the second conduits 902 of the condenser 602 for feeding at least partially vaporized coolant to the condenser 602 in an operating state of the thermosiphon cooler 600. A second manifold 914 is fluidly connected to the first conduits 912 of the evaporator 604 for feeding condensed coolant back to the evaporator 604 in an operating state of the thermosiphon cooler. A third manifold 916 is fluidly connected to the first conduits 912 of the evaporator 604 for collecting at least partially vaporized coolant from the evaporator 604 in an operating state of the thermosiphon cooler 600, the third manifold 916 being fluidly connected to the first manifold 904 via a fourth manifold 908 for feeding the at least partially vaporized coolant to the first manifold 904 in an operating state of the thermosiphon cooler. A fifth manifold 906 is fluidly connected to the second conduits 902 of the condenser 602 for collecting condensed coolant from the condenser 602 in an operating state of the thermosiphon cooler 600, the fifth manifold 906 being fluidly connected to the second manifold 914 via a sixth manifold 910 for feeding the condensed coolant to the second manifold 914 in an operating state of the thermosiphon cooler 600. The first manifold 904 is arranged above the third manifold 916 and the second manifold 914 such that in an operating state of the thermosiphon cooler 600 the condensed coolant is enabled to move by gravity through the second conduits 902 of the condenser 602 to the third manifold 916 and to the second manifold 914.

A filling manifold 918 is provided at the first manifold 904 for feeding coolant to the thermosiphon cooler 600. The condenser 602 includes cooling fins 922 which are arranged between the first conduits 912. The first manifold 904, the fifth manifold 906, and the first conduits 912 extend essentially in the horizontal direction 632. The fourth manifold 908, the sixth manifold 910, the filling manifold 918, and the second conduits 902 extend essentially in the vertical direction 634. The second manifold 914 and the third manifold 916 extend essentially in the lateral direction 630.

It is conceivable that the orientation of the condenser is rotated in a direction about the lateral axis 630 such that the second conduits 902 extend parallel to the tilt axis 622 in an alternative embodiment of the thermosiphon heat exchanger 600 compared to the one shown in FIG. 8.

Figure 9:
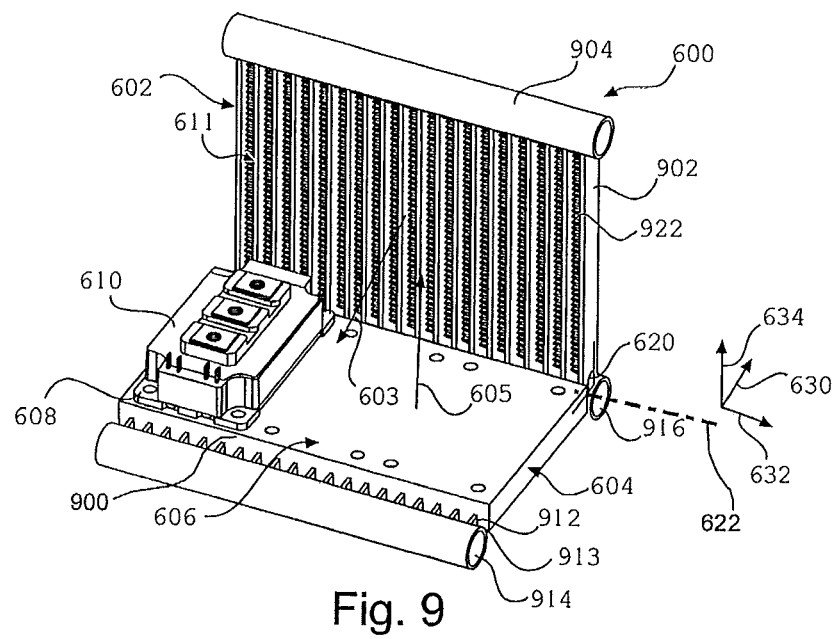
FIG. 9 schematically shows a perspective front view of a thermosiphon cooler according to an exemplary embodiment of the present disclosure.

FIG. 9 shows a perspective front view of another thermosiphon cooler 600 with a condenser 602 extending in the vertical direction 634 and an evaporator 604 extending in a lateral direction 630 such that the evaporator 604 is angled about the horizontal direction 632 by the angle 620 of approximately 90°. One electric or electronic component 610 is attached to the evaporator, to the second phase 606 of the evaporator 604 by attachment devices 608. First manifold 904 is fluidly connected to the first conduits 912 of the evaporator 604 via the third manifold 916 for collecting at least partially vaporized coolant from the evaporator 604 in an operating state of the thermosiphon cooler 600. The first manifold 904 is fluidly connected to the second conduits 902 of the condenser 602 for feeding the at least partially vaporized coolant to the condenser 602 in an operating state of the thermosiphon cooler. The second manifold 914 is fluidly connected to the second conduits 902 of the condenser 602 via the third manifold 916 and at least one condensate channel 913 of the first conduit 912 for collecting condensed coolant from the condenser 602 in an operating state of the thermosiphon cooler 600. The second manifold 914 is fluidly connected to the first conduits 912 of the evaporator 604 for feeding the condensed coolant back to the evaporator 604 in an operating state of the thermosiphon cooler 600. First manifold 904 is arranged above the second manifold 914 such that in an operating state of the thermosiphon cooler 600 the condensed coolant is enabled to move by gravity through the second conduits 902 of the condenser 602 to the second manifold 914. The first manifold 904 is arranged above the third manifold 916. The first manifold 904, the second manifold 914, and the third manifold 916 extend in the horizontal direction 632 and are arranged essentially parallel to each other.

Figure 10:
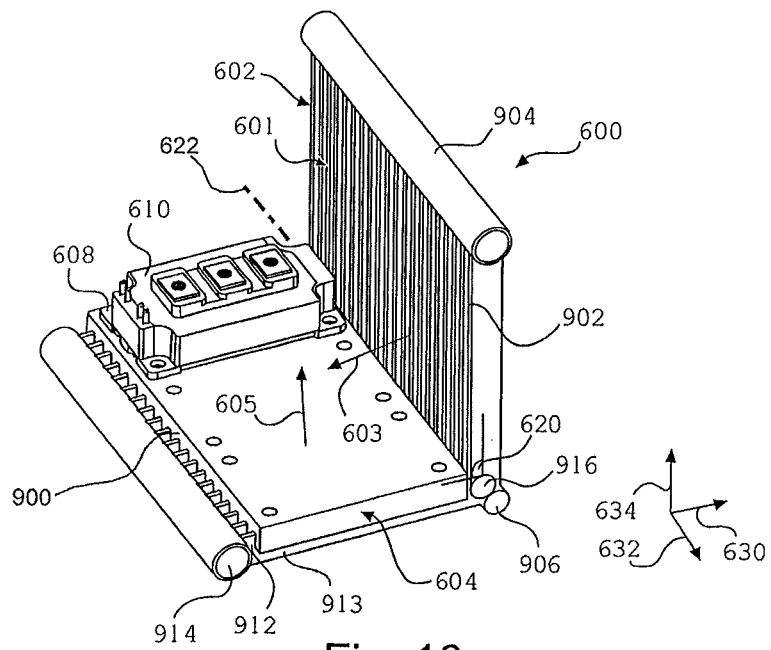
FIG. 10 schematically shows a perspective side view of a thermosiphon cooler according to an exemplary embodiment of the present disclosure.

FIG. 10 schematically shows a perspective side view of another thermosiphon cooler 600 similar to the thermosiphon cooler 900 of FIG. 9, with the difference, that there is an additional fifth manifold 906 arranged near the third manifold 916, wherein the third manifold 916 is fluidly connected to the first conduits 912 of the evaporator 604 for collecting at least partially vaporized coolant from the evaporator 604 in an operating state of the thermosiphon cooler 600, the third manifold 916 being fluidly connected to the first manifold 904 for feeding the at least partially vaporized coolant to the first manifold 904 in an operating state of the thermosiphon cooler. The fifth manifold 906 is fluidly connected to the second conduits 902 of the condenser 602 for collecting condensed coolant from the condenser 602 in an operating state of the thermosiphon cooler, the fifth manifold 906 being fluidly connected to the second manifold 914 via the at least one condensate channel 913 for feeding the condensed coolant to the second manifold 914 in an operating state of the thermosiphon cooler.

Figure 11:
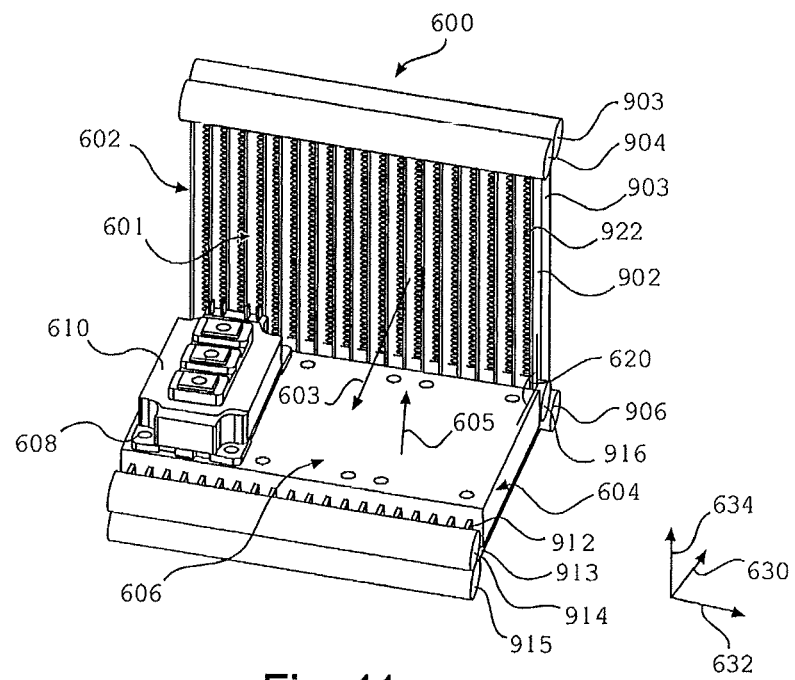
FIG. 11 schematically shows a perspective front view of a thermosiphon cooler according to an exemplary embodiment of the present disclosure.

FIG. 11 schematically shows a perspective front view of another thermosiphon cooler 600 which differs from the thermosiphon cooler 600 of FIG. 9 in that the cooler 600 includes two evaporators 604 and two condensers 602 arranged next to each other, or in other words two thermosiphon coolers arranged above each other. One evaporator 604 receives a first heat load from the at least one electric and/or electronic component 610 and the other evaporator which is arranged below this evaporator 604 is receiving part of that first heat load via the evaporator 604 to the at least one electric and/or electronic component 610 is attached to and thermally connected with. A seventh manifold 915 is provided for the other evaporator and other condenser which operates similar as the second manifold 914 of FIG. 9 and an eighth manifold 903 is provided for the other evaporator and the other condenser which operates similar as the first manifold 904 of FIG. 9. A fifth manifold 906 is provided for the other evaporator and the other condenser which operates similar as the third manifold 916 of FIG. 9. All manifolds extend essentially in the horizontal direction 632.

Figure 12:
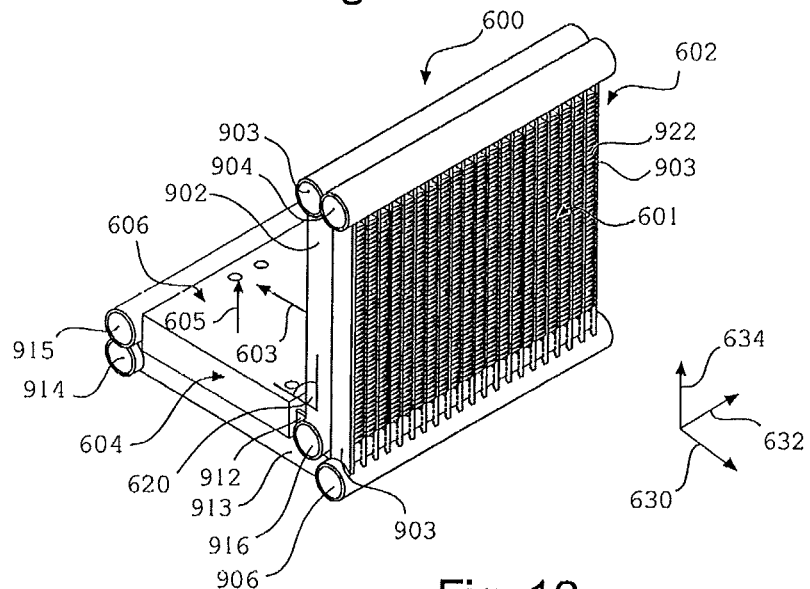
FIG. 12 schematically shows a perspective back view of the thermosiphon cooler of FIG. 11.

FIG. 12 schematically shows a perspective back view of the thermosiphon cooler 600 of FIG. 11.

Figure 13:
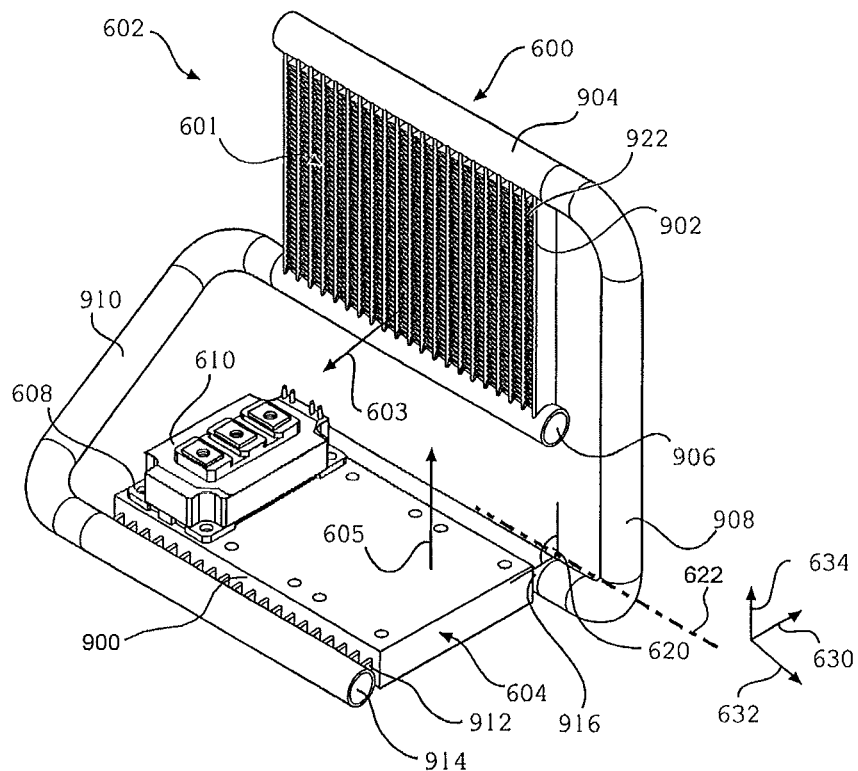
FIG. 13 schematically shows a perspective front view of a thermosiphon cooler according to an exemplary embodiment of the present disclosure.

FIG. 13 schematically shows a perspective front view of another thermosiphon cooler 600, wherein the evaporator 604 is arranged offset to the condenser 602 and angular to the condenser 602 angled about the horizontal direction 632 with an angle 620 of approximately 90° between the first main normal direction 603 and the second main normal direction 605. The thermosiphon cooler 600 has similar components and operates in a similar way as the thermosiphon cooler 600 of FIG. 8 with the differences that the first conduits 912 extend essentially in the lateral direction 630, that the second manifold 914, the third manifold 916, and the fifth manifold 906 extend essentially in the horizontal direction 632, and that the sixth manifold 910 extends essentially in a plane defined by the lateral direction 630 and the vertical direction 634 inclining from the evaporator 604 to the condenser 602 which is arranged above the evaporator 604.

It is conceivable that the orientation of the evaporator 604 is rotated in a direction about the vertical axis 634 such that the first conduits 912 extend in the lateral direction 630 in an alternative embodiment of the thermosiphon heat exchanger 600 compared to the one shown in FIG. 13.

Figure 14:
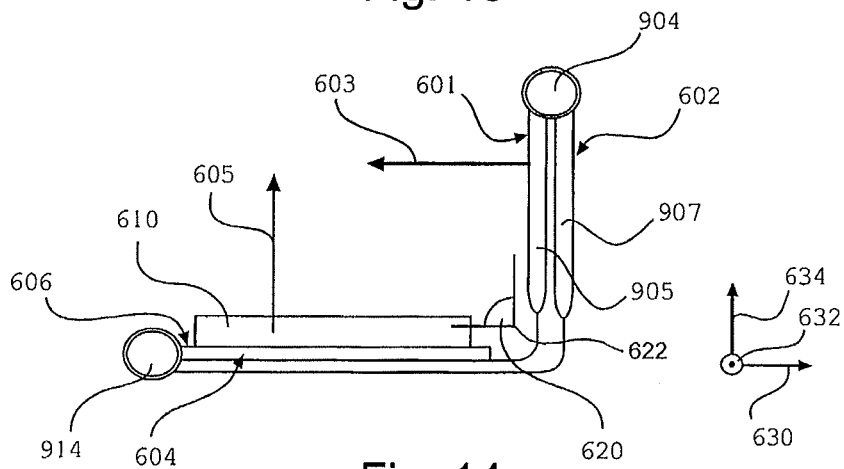
FIG. 14 schematically shows a cross-sectional side view of a thermosiphon cooler according to an exemplary embodiment of the present disclosure.

FIG. 14 schematically shows a cross-sectional side view of another thermosiphon cooler 600 similar to the thermosiphon cooler 600 shown in FIG. 9 with the differences described in the following. A first manifold 904 is fluidly connected to the first conduits of the evaporator 604 via tilted vapour channel 905 for collecting at least partially vaporized coolant from the evaporator 604 in an operating state of the thermosiphon cooler 600. The first manifold 904 is fluidly connected to the second conduits of the condenser which may be a tilted condensate channel 907 for feeding the at least partially vaporized coolant to the condenser 602 in an operating state of the thermosiphon cooler. The second manifold 914 is fluidly connected to the second conduits of the condenser, which may be a tilted condensate channel 907 for collecting condensed coolant from the condenser 602 in an operating state of the thermosiphon cooler. The second manifold 914 is fluidly connected to the first conduits of the evaporator 604 for feeding the condensed coolant back to the evaporator 604 in an operating state of the thermosiphon cooler 600. The first manifold 904 is arranged above the second manifold 914 such that in an operating state of the thermosiphon cooler 600 the condensed coolant is enabled to move by gravity through the second conduits of the condenser 602 to the second manifold 914. The first manifold 904 and the second manifold 914 extend in the horizontal direction 632, the evaporator 604 extends in the lateral direction 630, and the condenser 602 extends in the vertical direction 634.

Figure 15:
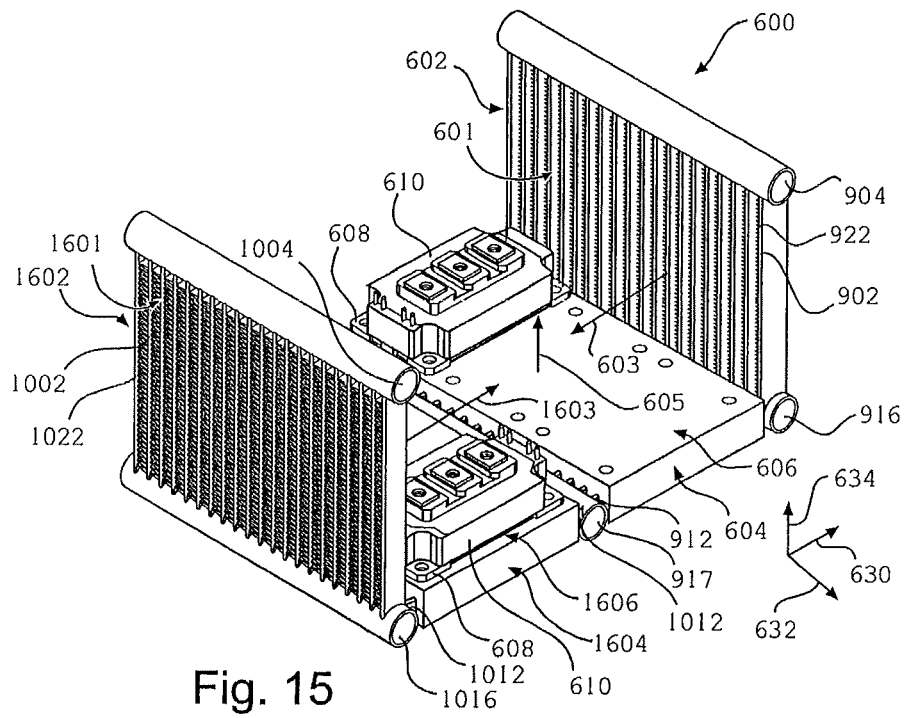
FIG. 15 schematically shows a perspective side view of a thermosiphon cooler with two thermosiphon coolers according to an exemplary embodiment of the present disclosure.

FIG. 15 schematically shows a thermosiphon cooler 600 which includes two thermosiphon coolers of FIG. 9 which are attached to each other in such a way, that they share the second manifold in form of a condensate collecting manifold 917 (second manifold 914 of FIG. 9), and such that the evaporators 604, 1604 extend in the lateral direction 630 and the condensers 602, 1602 extend in the vertical direction 634 opposite of each other facing each other. The evaporator 604 and the condenser 602 operate according to the evaporator 604 and the condenser 602 of FIG. 9. The other evaporator 1604 and the other condenser 1602 operate in a similar way. A coolant is transferring heat from the other evaporator 1604 to the other condenser 1602 which heat may be a first heat load generateable by an electric and/or electronic component 610. An eleventh manifold 1004 is fluidly connected to at least one fourth conduit 1002 of the other condenser 1602 for feeding at least partially vaporized coolant to the other condenser 1602 in an operating state of the thermosiphon cooler 600. The condensate collecting manifold 917 is fluidly connected to third conduits 1012 of the other evaporator 1604 for feeding condensed coolant back to the other evaporator 1604 in an operating state of the thermosiphon cooler 600. A thirteenth manifold 1016 is fluidly connected to the third conduits 1012 of the other evaporator 1604 for collecting at least partially vaporized coolant from the other evaporator 1604 in an operating state of the thermosiphon cooler 600. The thirteenth manifold 1016 is fluidly connected to the eleventh manifold 1004 for feeding the at least partially vaporized coolant to the eleventh manifold 904 in an operating state of the thermosiphon cooler 600. The thirteenth manifold 1016 is fluidly connected to the fourth conduits 1002 of the other condenser 1602 for collecting condensed coolant from the other condenser 1602 in an operating state of the thermosiphon cooler 600. The thirteenth manifold 1016 is fluidly connected to the condensate collecting manifold 917 for feeding the condensed coolant to the condensate collecting manifold 917 in an operating state of the thermosiphon cooler 600. The eleventh manifold 904 is arranged above the thirteenth manifold 1016 and the condensate collecting manifold 917 such that in an operating state of the thermosiphon cooler 600 the condensed coolant is enabled to move by gravity through the fourth conduits 1002 of the other condenser 1602 to the thirteenth manifold 1016 and to the condensate collecting manifold 917. The other condenser 1602 includes a fifth face 1601 which is similar to the first face 601 of the condenser 602 as well as other cooling fins 1022 which are arranged between the fourth conduits 1002 of the other condenser 1602. The other evaporator 1604 includes a fourth face 1606 which is similar to the second face 606 of the evaporator 604.

Figure 16:
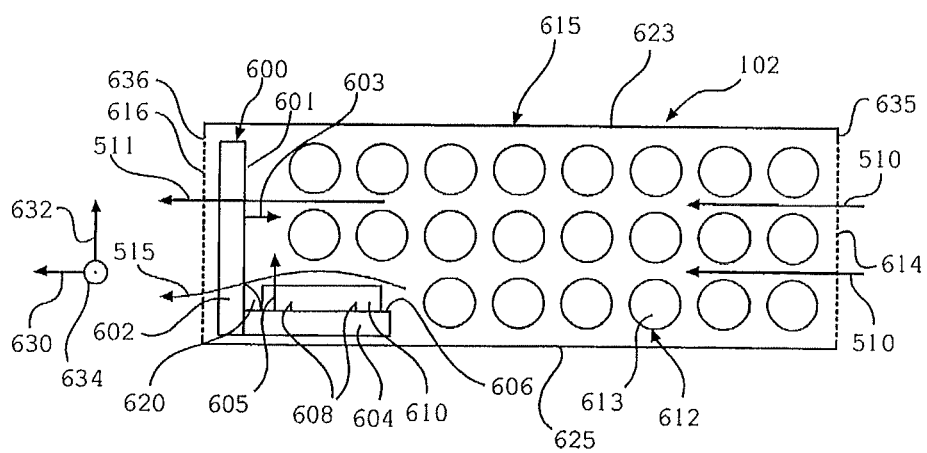
FIG. 16 schematically shows a cross-sectional side view of a module of an electric and/or electronic system according to an exemplary embodiment of the present disclosure.

FIG. 16 schematically shows a module 102 which differs from the module 102 of FIG. 5 in that the capacitors 612 or the capacitor bodies extend in the vertical direction 634 of the module 102 instead of the horizontal direction 632. The electric capacitors 612 are arranged between the inlet 614 and the planar-shaped first face 601 of the condenser 602 and the planar-shaped second face 606 of the evaporator 604.

Figure 17:
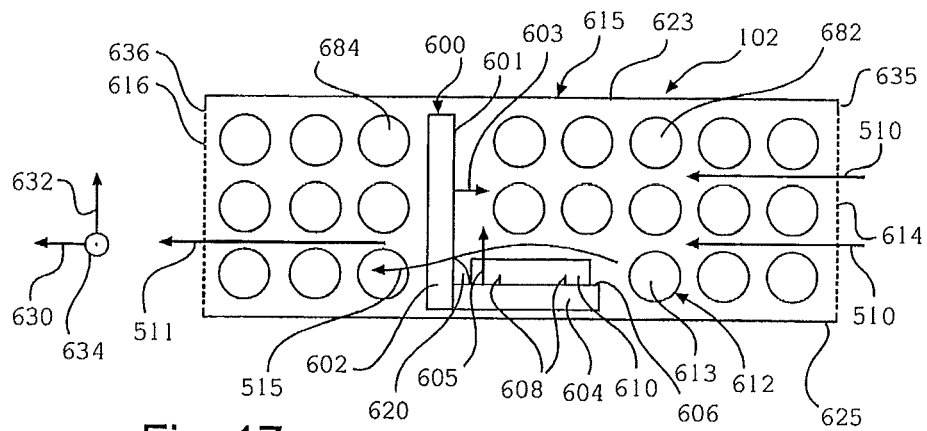
FIG. 17 schematically shows a cross-sectional side view of a module of an electric and/or electronic system with a thermosiphon cooler according to an exemplary embodiment of the present disclosure.

FIG. 17 schematically shows a module 102 which differs from the module of FIG. 16 in that first capacitors 682 are provided, that are arranged at least partially between the inlet 614 and the condenser 602, and that second capacitors 684 are arranged at least partially between the condenser 602 and the outlet 616.

Figure 18:
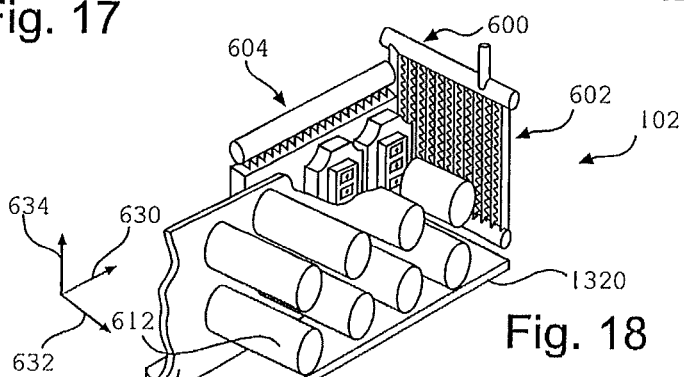
FIG. 18 schematically shows a perspective front view of part of a module of an electric and/or electronic system with a thermosiphon cooler according to an exemplary embodiment of the present disclosure.

FIG. 18 schematically shows a perspective front view of the module 102 of FIG. 5, wherein the capacitors extend in the horizontal direction 632 and are attached to a guiding portion 619, for example a bus bar for electrically connecting the capacitors to the at least one electric and/or electronic component. The evaporator 604 extends in the vertical direction 634 and is angled about the vertical direction 634 by an angle of about 90° with respect to the condenser 602 between the first main normal direction and the second main normal direction. The first face of the condenser 602 is arranged in a first plane defined by the vertical direction 634 and the horizontal direction 632 of the thermosiphon cooler, the horizontal direction 632 being transverse to the vertical direction 634 and transverse to the lateral direction 630 of the thermosiphon cooler. The second face of the evaporator 604 is arranged a plane defined by the vertical direction 634 and the lateral direction 630.

The module 102 has a first guiding means 1320 for easing inserting and exchanging the module 102 into and out of a higher entity such as a power converter, for example. For that purpose the higher entity such as the power converter cabinet includes a second guiding means 1321 for co-operating with the first guiding means 1320 such that the module 102 is insertable and deployable in a drawer-like manner in and out of the aforementioned power converter cabinet, see e.g. the cabinet 400 shown in FIG. 2, for example. In a basic embodiment of the module 102, the first guiding means 1320 are formed by the lateral edges of the guiding portion 619 provided for guiding the cooling medium through the module 102. In a basic embodiment of the cabinet 400, the second guiding means 1321 are formed by slots in the sheet-metal structure of the cabinet 400, wherein the slots are dimensioned such that they provide just enough space for securely inserting and deploying the first guiding means 1320 of the guiding portion 619. However, a guiding system including rollers or the like may be employed for reducing the friction and improving the manipulation, where desired.

Figure 19:
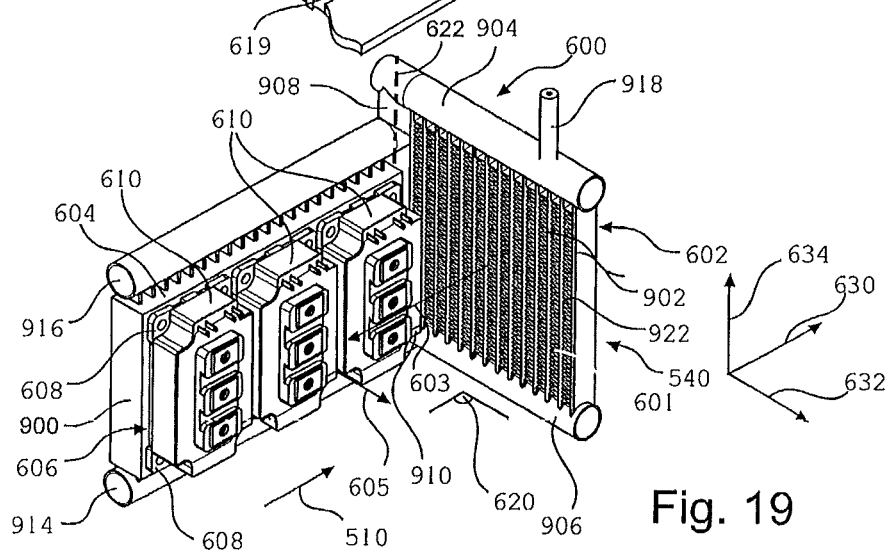
FIG. 19 schematically shows a perspective front view of the thermosiphon cooler of FIG. 18.

FIG. 19 schematically shows a perspective front view of the thermosiphon cooler 600 of FIG. 18. A filling manifold 918 for filling the thermosiphon cooler 600 with a coolant is provided at the first manifold 904 which is fluidly connected to the second conduits 902 of the condenser 602 for feeding at least partially vaporized coolant to the condenser 602 in an operating state of the thermosiphon cooler 600. A second manifold 914 is fluidly connected to the first conduits (912, not shown) for feeding condensed coolant back to the evaporator 604 in an operating state of the thermosiphon cooler 600. Third manifold 916 is fluidly connected to the first conduits of the evaporator 604 for collecting at least partially vaporized coolant from the evaporator 604 in an operating state of the thermosiphon cooler 600. The third manifold 916 is fluidly connected to the first manifold 904 via a fourth manifold 908 for feeding the at least partially vaporized coolant to the first manifold 904 in an operating state of the thermosiphon cooler 600.

A fifth manifold 906 is fluidly connected to the second conduits 902 of the condenser 602 for collecting condensed coolant from the condenser 602 in an operating state of the thermosiphon cooler 600, the fifth manifold 906 being fluidly connected to the second manifold 914 for feeding the condensed coolant to the second manifold 914 in an operating state of the thermosiphon cooler 600. The first manifold 904 is arranged above the fifth manifold 906 and the second manifold 914 such that in an operating state of the thermosiphon cooler 600 the condensed coolant is enabled to move by gravity through the second conduits 902 of the condenser 602 to the fifth manifold 906 and to the second manifold 914. A sixth manifold 910 is provided for fluidly connecting the second manifold 914 to the fifth manifold 906. First conduits, fourth manifold 908 and sixth manifold 910 extend essentially in the vertical direction 934, second manifold 914 and third manifold 916 extend essentially in the lateral direction 630, and first manifold 904 and fifth manifold 906 extend essentially in the horizontal direction 632. If the thermal capacity of the condenser 602 in FIG. 19 is too limited the user may choose to expand the condenser in the horizontal direction 632 by a couple of additional second conduits 902.

In yet another alternative embodiment similar to the one shown and explained with respect to FIG. 19, the first manifold 904 is connected directly to the third manifold 916 such that the intermediate fourth manifold 908 can be omitted. Depending on the embodiment, the second manifold 914 is connectable directly to the fifth manifold 906 such that the intermediate sixth manifold 910 can be omitted. In an even more simplified embodiment the first manifold 904 and the third manifold 916 are formed from a pipe by bending. Likewise the second manifold 914 and the fifth manifold 906 are formed from another pipe by bending, too. In such an embodiment, the maximal dimensions of the thermosiphon depend on the minimum bending radius of the pipe for the manifolds 904, 916, 914, 906.

Figure 20:
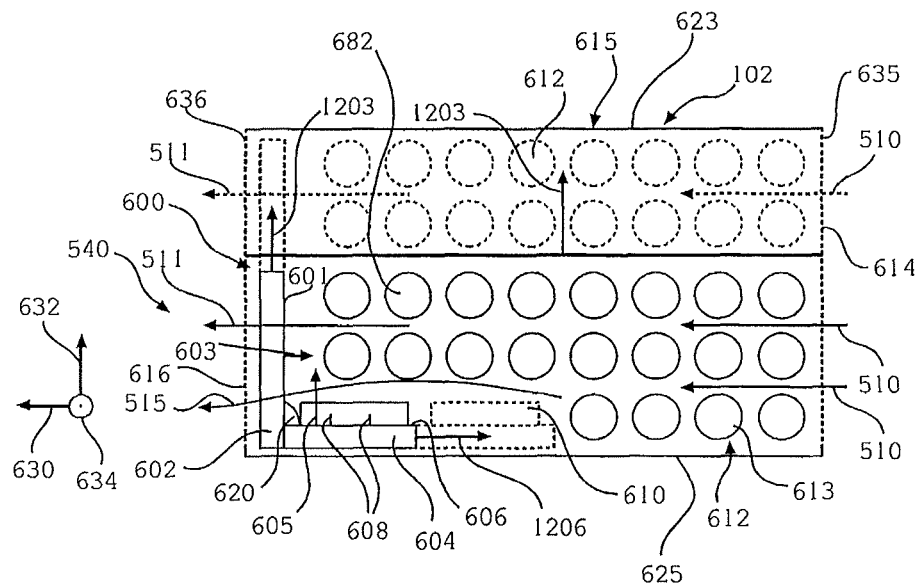
FIG. 20 schematically shows a cross-sectional side view of a module of an electric and/or electronic system with a thermosiphon cooler according to an exemplary embodiment of the present disclosure.

FIG. 20 schematically shows the thermosiphon cooler 600 according to FIG. 16 where it is additionally indicated by dotted lines, that the condenser 602 may be extended in the horizontal direction 632 increasing the height of the module 102 (indicated by horizontal arrow 1203), and that the evaporator 604 may be extended in its length within the existing dimensions of the module 102 in the lateral direction 630 (indicated by lateral arrow 1206) to account for higher cooling needs, wherein the extra module condenser length may be used and needed for additional electrical capacitors 612. The depths and lengths and basic design of the module may remain the same. Thus, power scaling of a module 102 may be achieved, without changing the basic design and the modular character of the module 102.

Figure 21:
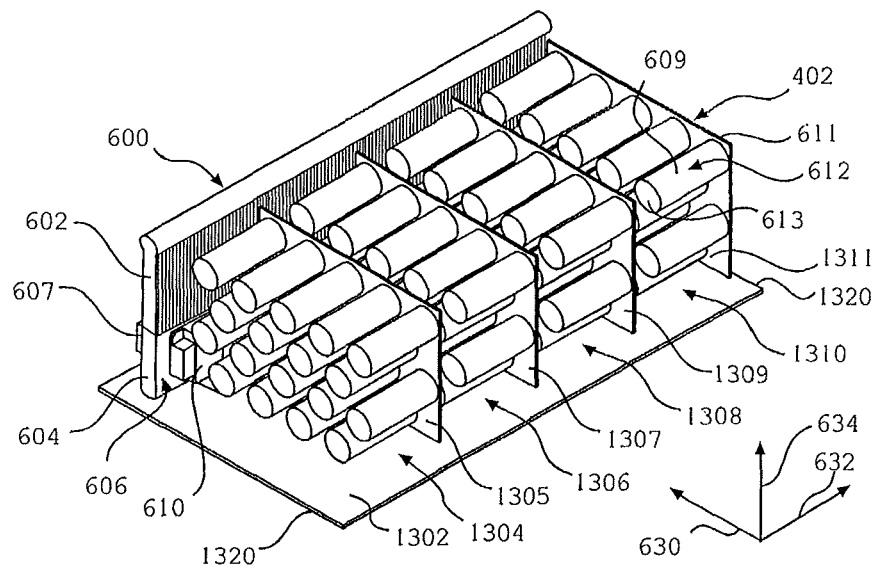
FIG. 21 schematically shows a perspective front view of a module block according to an exemplary embodiment of the present disclosure.

FIG. 21 schematically shows a perspective front view of a module block 402 which is shown in FIG. 2 and FIG. 3. A thermosiphon cooler 600 is provided with an evaporator 604 and a condenser 602 extending in the vertical direction 634 of the module block 402. Several electric or electronic components 610, 607 are attached to the evaporator 604. A plurality of electric and electronic components 610 is thermally connected to a planar-shaped first face 606 of the evaporator 604 facing a plurality of electric capacitors 612. At least one further electric and/or electronic component 607 is thermally connected to a planar-shaped third face (677, not shown, see FIG. 22, for example) of the evaporator 604 opposite the planar-shaped second face 606 of the evaporator 604. Each capacitor 612 has an elongated capacitor body 609 extending from a bottom face 611 to a top face 613 of the capacitor body 609 in a horizontal direction 632.

A first capacitor portion 1310 is provided to include a first guiding portion 1311 extending in the vertical direction 634 and the lateral direction 630, wherein a plurality of capacitors 612 extending in the horizontal direction 632 are attached to the first guiding portion 1311. A second capacitor portion 1308 is provided with a second guiding portion 1309 and capacitors arranged similar to the capacitors of the first capacitor portion 1310. The second capacitor portion 1308 is arranged next to the first capacitor portion 1310 in the horizontal direction 632. A third capacitor portion 1306 with a third guiding portion 1307 and a fourth capacitor portion 1304 with a fourth guiding portion 1305 similar to the first capacitor portion 1310 are provided and arranged next to the second capacitor portion 1308 in the horizontal direction 632. The guiding portions 1311, 1309, 1307, and 1305 may be provided for electrically connecting the capacitors to the electric and/or electronic components 610, 677. Cooling air flows in a flow direction parallel to the lateral direction 630 first passing the capacitors 612 and then passing through the condenser 602. Each of the capacitor portions 1310, 1308, 1306, 1304 may correspond to one module 102, as shown in FIG. 2, for example, wherein the thermosiphon cooler 600 is shared by the capacitor portions or modules. A base plate 1302 is provided for attaching the guiding portions 1311, 1309, 1307, 1305 and the thermosiphon cooler 600 as well as the connectors (1402, not shown, see FIGS. 22-24). The module block 402 may be a full bridge configuration allowing for a standard dimensioned container integration of the module blocks 402 with two rows of modules. The above described capacitor portions may be capacitor blocks.

The module block 402 has a first guiding means 1320 for easing inserting and exchanging the module block 402 into and out of a higher entity such as a power converter, for example. For that purpose, the higher entity such as the power converter cabinet includes a second guiding means 1321 for co-operating with the first guiding means 1320 such that the module block 402 is insertable and deployable in a drawer-like manner in and out of the aforementioned power converter cabinet, see e.g. the cabinet 400 shown in FIG. 2, for example. In a basic embodiment of the module block 402, the first guiding means 1320 are formed by the lateral edges of the base plate 1302 that is provided for assisting guidance of the cooling medium through the module block 402. In a basic embodiment of the cabinet 400, the second guiding means 1321 are formed by slots in the sheet-metal structure of the cabinet 400, wherein the slots are dimensioned such that they provide just enough space for securely inserting and deploying the first guiding means 1320 of the module block 402.

Figure 22:
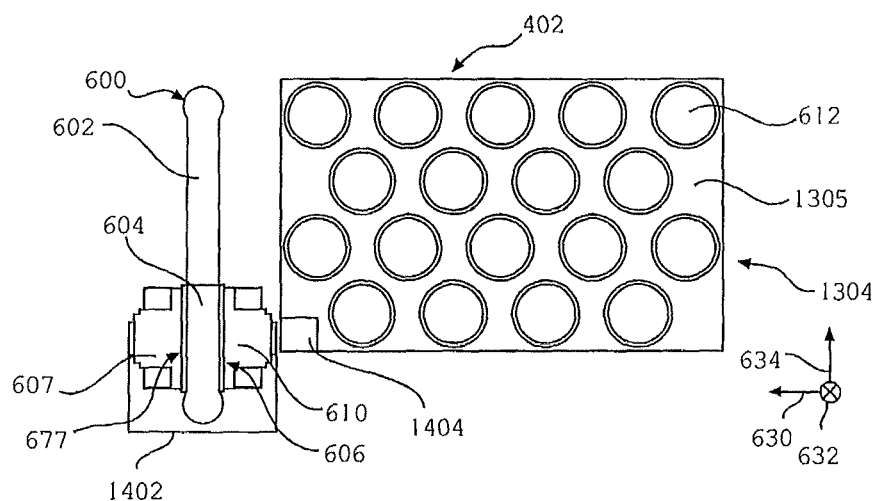
FIG. 22 schematically shows a cross-sectional side view of the module block of FIG. 21.

FIG. 22 schematically shows a cross-sectional side view of the module block 402 of FIG. 21, where it is shown that each of the capacitor portions or modules are electrically connectable via a connector 1402 from outside and from the inside of the module block 402. The cold cooling air intake will come from the right side of the module block 402 and then, after passing the condensers 612 in the lateral direction 630, pass the condenser 602 at the left side. The cooling air flow may also be used to cool other passives such as copper links down or to simply allow for higher current densities in bus bars. Bus bars or rail terminals may be wound around the cooler 600 to form a link to terminals.

Figure 23:
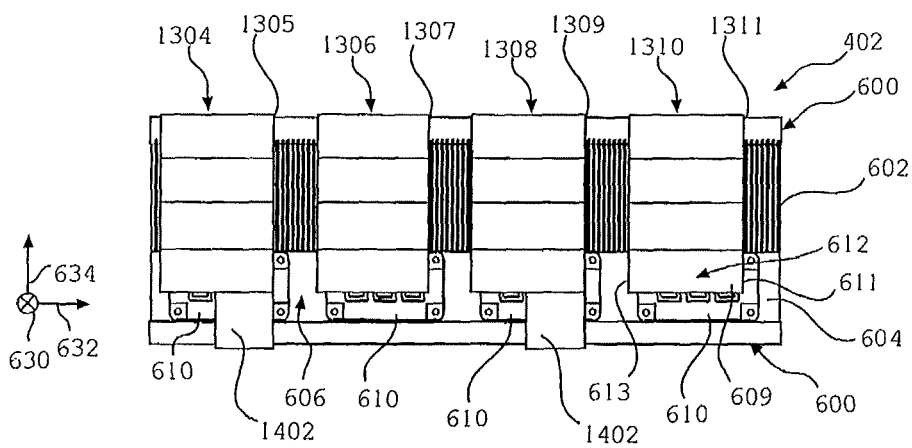
FIG. 23 schematically shows a cross-sectional back view of the module block of FIG. 21 and FIG. 22.

FIG. 23 schematically shows a cross-sectional front view of the module block 402 of FIG. 21 and of FIG. 22, with two connectors 1402.

Figure 24:
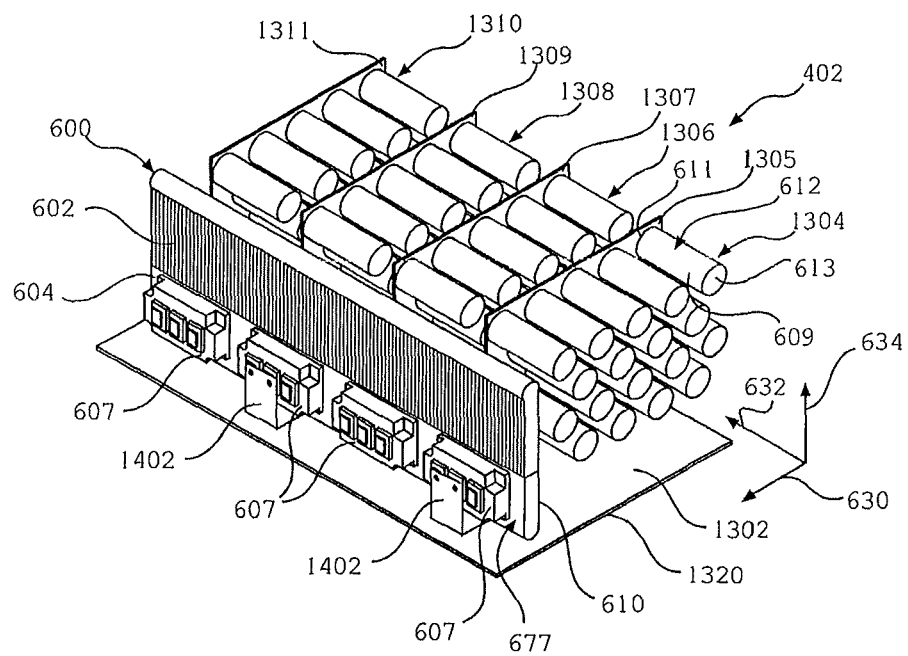
FIG. 24 schematically shows a perspective back view of the module block of FIG. 21, FIG. 22 and FIG. 23.

FIG. 24 schematically shows a perspective back view of the module block 402 according to FIGS. 21, 22, 23.

Figure 25:
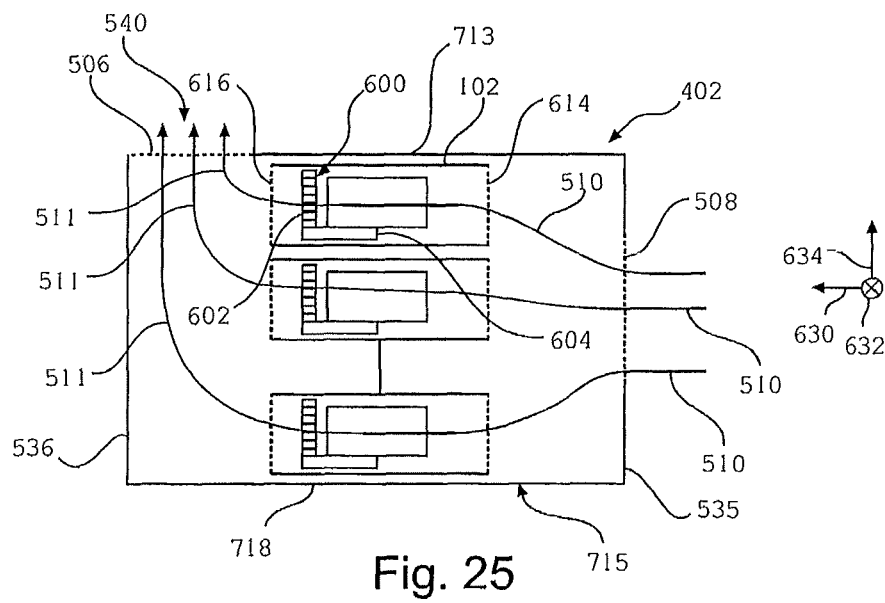
FIG. 25 schematically shows a cross-sectional side view of a module block according to an exemplary embodiment of the present disclosure.

FIG. 25 schematically shows a cross-sectional side view of a module block 402 as shown in FIG. 2 and FIG. 3, for example, with a plurality of modules 102 arranged above each other, in the vertical direction 634, each module 102 designed for example according to FIG. 7. In FIG. 25 and the following FIGS. 26, 27 and 28 modules 102 may be provided according to any embodiments described according to the preceding figures, embodiments and aspects and the appended claims. The module block 402 includes a module block enclosure 715 with a first port 508 for receiving a stream of cooling air flowing in the flow direction 510, wherein the module block enclosure 715 is configured to guide the cooling air to the inlet 614 of each of the modules 102, and wherein the module block enclosure 715 includes a second port 506 for releasing the cooling air thereafter in an operating state of the module block 402, and the cabinet 400, respectively. The first port 508 is arranged at a right module block side 535 extending in the vertical direction 634, and the second port 506 is arranged at a top module block side 713 extending in the lateral direction 630. The module block enclosure 715 further includes a bottom module block side 718 extending in the lateral direction below the top module block side 713 and a Back module block side 536 extending in the vertical direction 634 opposite to the Front module block side 535. The cooling air flows in a release flow direction 511 after passing through each module towards the upper part of the module block and through the second port 506 to the cabinet enclosure.

Figure 26:
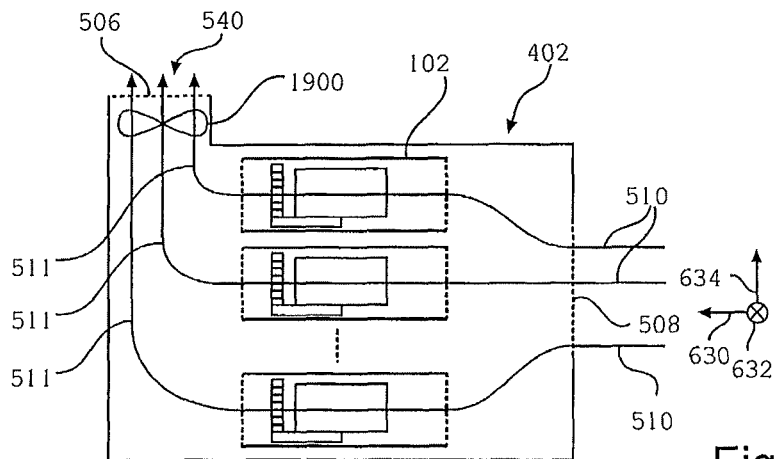
FIG. 26 schematically shows a cross-sectional side view of a module block according to an exemplary embodiment of the present disclosure.

FIG. 26 schematically shows a cross-sectional side view of a module block 402 according to FIG. 25 with the difference, that a second fan 1900 is arranged at the second port 506 of the module block 402.

Figure 27:
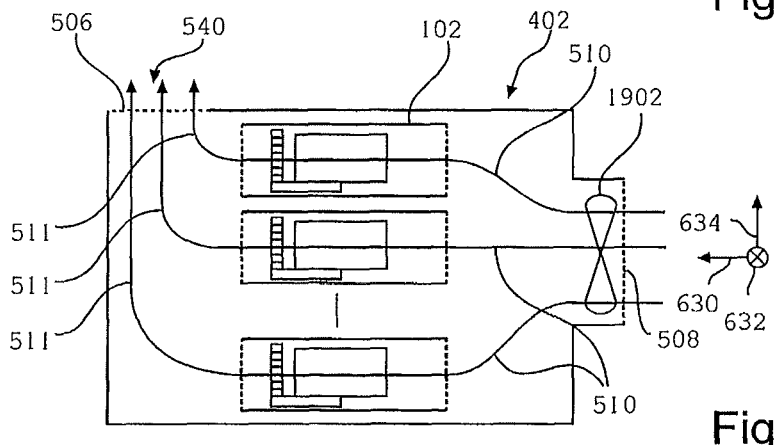
FIG. 27 schematically shows a cross-sectional side view of a module block according to an exemplary embodiment of the present disclosure.

FIG. 27 schematically shows a cross-sectional side view of the module block 402 of FIG. 25 with the difference, that another second fan 1902 is arranged at the first port 508 of the module block 502.

Figure 28:
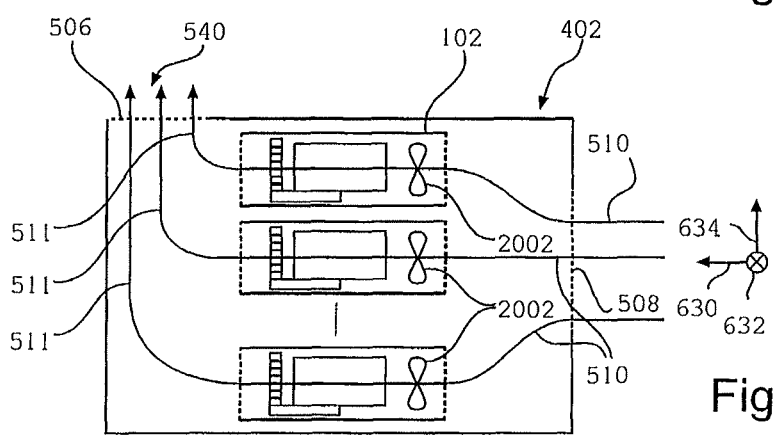
FIG. 28 schematically shows a cross-sectional side view of a module block according to an exemplary embodiment of the present disclosure.

FIG. 28 schematically shows a cross-sectional side view of the module block 402 of FIG. 25 with the difference, that a first fan 1202 is arranged at the inlet of each module 102.

By providing fans as described in FIGS. 26 to 28 and also in FIGS. 2 and 3, the cooling efficiency and capacity may be enhanced by providing a forced convection of the cooling air for cooling the cabinet 400. The module block 402 generally may include at least one second fan 1900, 1902 being arranged at at least one of the first port 508 and the inlet 614 of at least one of the modules 102, and the second port 506 and the outlet 616 of at least one of the modules 102.

At least one of the at least two modules 102 may include at least one first fan 2002 being arranged at at least one of the inlet 614 and the outlet 616. The cabinets 400 may include at least one third fan 404 arranged at at least one of the first aperture 502 and the second aperture 520.

While the present disclosure has been illustrated and described in detail in the drawings and the foregoing description, such illustrations and descriptions are considered illustrative or exemplary and not restrictive, the disclosure being not limited to the disclosed embodiments.

Other variations to the disclosed embodiments may be understood and effected by those skilled in the art in practising the present disclosure from a study of the drawings, the disclosure, and the appended claims.

In the claims, the word "comprising" or "including" does not exclude other elements, and the indefinite article "a" or "an" does not exclude a plurality. The single electric and/or electronic system or a single cabinet or module block or module may fulfil the function of several items recited in the claims. The mere fact that certain measures are recited in mutually different dependent claims does not indicate that a combination of these measures may not be used to advantage. Any reference signs in the claims should not be construed as limiting the scope.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

| | | | |
|---|---|---|---|
| 102 | Module | 610 | Electric and/or electronic component |
| 200 | Electric and/or electronic system | 611 | Bottom face |
| 202 | Switch, IGBT, | 612 | Electric capacitor |
| 204 | Capacitor | 613 | Top face |
| 402 | Module block | 614 | Inlet |
| 404 | Third fan | 615 | Guiding structure |
| 406 | Cabinet housing | 616 | Outlet |
| 408 | Top cabinet side | 617 | Top module side |
| 409 | Left cabinet side | 618 | Bottom module side |
| 410 | Bottom cabinet side | 619 | Guiding portion |
| 411 | Right cabinet side | 620 | Angle, tilt angle |
| 412 | Back cabinet side | 621 | Connecting line |
| 413 | Front cabinet side | 622 | tilt axis/tilting axis |
| 502 | First aperture | 623 | Right module side |
| 504 | Third aperture | 625 | Left module side |
| 506 | Second port | 630 | Lateral direction |
| 508 | First port | 632 | Horizontal direction |
| 510 | Flow direction | 634 | Vertical direction |
| 511 | Release flow direction | 635 | Front module side |
| 512 | Cabinet channel | 636 | Back module side |
| 513 | Deflected flow direction | 670 | Module space |
| 514 | Ambient flow direction | 677 | Third face |
| 515 | Slightly deflected flow direction | 682 | First capacitor |
| | | 684 | Second capacitor |
| 520 | Second aperture | 715 | Module block enclosure |
| 535 | Front module block side | 717 | Top module block side |
| 536 | Back module block side | 718 | Bottom module block side |
| 540 | Ambient | 723 | Right module block side |
| 600 | Thermosiphon cooler | 725 | Left module block side |
| 601 | First face | 900 | heat transfer element |
| 602 | Condenser | 902 | Second conduit |
| 603 | First main normal direction | 903 | Eighth manifold |
| 604 | Evaporator | 904 | First manifold |
| 605 | Second main normal direction | 905 | Tilted vapour channel |
| 606 | Second face | 906 | Fifth manifold |

LIST OF REFERENCE SYMBOLS

| | |
|---|---|
| 607 | Further electric and/or electronic component |
| 608 | Attachment device(s) |
| 609 | Capacitor body |
| 910 | Sixth manifold |
| 912 | First conduit |
| 913 | Condensate channel |
| 914 | Second manifold |
| 915 | Seventh manifold |
| 916 | Third manifold |
| 917 | Condensate collecting manifold |
| 918 | Filling manifold |
| 922 | Cooling fin(s) |
| 1002 | Fourth conduit |
| 1004 | Eleventh manifold |
| 1012 | Third conduit |
| 1016 | Thirteenth manifold |
| 1022 | Other cooling fins |
| 1203 | Horizontal arrow |
| 1206 | Lateral arrow |
| 1302 | Base plate |
| 1304 | Fourth capacitor portion |
| 1305 | Fourth guiding portion |
| 1306 | Third capacitor portion |
| 1307 | Third guiding portion |
| 1308 | Second capacitor portion |
| 1309 | Second guiding portion |
| 1310 | First capacitor portion |
| 1311 | First guiding portion |
| 1320 | First guiding means |
| 1321 | Second guiding means |
| 1402 | Connector(s) |
| 1601 | Fifth face |
| 1602 | Other condenser |
| 1603 | Third main normal direction |
| 1604 | Other evaporator |
| 1606 | Fourth face |
| 1900 | Second fan |
| 1902 | Other second fan |
| 2002 | First fan |
| 907 | Tilted condensate channel |
| 908 | Fourth manifold |

What is claimed is:

1. A module of an electric and/or electronic system, the module comprising:
   a guiding structure having an inlet for receiving a stream of cooling air, and an outlet for releasing the stream of cooling air thereafter in an operating state of the module, the guiding structure being configured to guide the cooling air through the inlet, from there through the module, and thereafter through the outlet in an operating state of the module, the guiding structure being formed such that the design of the module is compact;
   a thermosiphon cooler which includes an evaporator for receiving a first heat load generated by at least one electric and/or electronic component of the module in an operating state of the module, and which includes a condenser for transferring a majority of the first heat load to the cooling air such that a major portion of the stream of cooling air is allowed to flow through openings in the condenser in an operating state of the module, wherein:
   the evaporator and the condenser form a loop-type thermosiphon;
   the evaporator is tilted with respect to the condenser about a tilt axis;
   the at least one electric and/or electronic component is thermally connectable to a planar second face of the evaporator such that the at least one electric and/or electronic component is located in between the inlet and the outlet;
   the evaporator includes a plurality of first conduits extending below and alongside the second face of the evaporator; and
   the condenser is arranged between the inlet and the outlet such that a major portion of the cooling air flows in a flow direction transverse to a planar shaped first face of the condenser through the condenser to transfer the majority of the first heat load to the cooling air in an operating state of the module.

2. The module of claim 1, wherein the evaporator is arranged at a position that is geometrically offset to the condenser.

3. The module of claim 1, wherein the first face of the condenser is arranged in a first plane defined by a vertical direction and a horizontal direction of the module, the horizontal direction being transverse to the vertical direction and transverse to a lateral direction of the module, and
   wherein the evaporator is tilted with respect to the condenser about the horizontal direction about the tilt axis by an angle of about 90 degrees.

4. The module of claim 1, wherein the first face of the condenser is arranged in a first plane defined by a vertical direction and a horizontal direction of the module, the horizontal direction being transverse to the vertical direction and transverse to a lateral direction of the module, and
   wherein the evaporator is tilted with respect to the condenser about the vertical direction about the tilt axis by an angle of about 90 degrees.

5. The module of claim 1, comprising:
   at least one electric capacitor being electrically connected to the at least one electric and/or electronic component, wherein a majority of a second heat load generated by the at least one electric capacitor is removable by the cooling air via the outlet in an operating state of the module.

6. The module of claim 5, wherein the at least one electric capacitor is arranged between the inlet and at least one of:
   a) the first face of the condenser, and
   b) a planar shaped second face of the evaporator.

7. The module of claim 5, wherein the at least one electric capacitor comprises:
   a first capacitor being arranged at least partially between the inlet and the condenser; and
   a second capacitor being arranged at least partially between the condenser and the outlet.

8. The module of claim 5, wherein the at least one electric capacitor comprises an elongated capacitor body extending in a vertical direction of the module, the vertical direction being transverse to a lateral direction and a horizontal direction of the module, and the lateral direction being transverse to the horizontal direction.

9. The module of claim 5, wherein the at least one electric capacitor comprises an elongated capacitor body extending in a horizontal direction of the module, the horizontal direction being transverse to a lateral direction and a vertical direction of the module, and the lateral direction being transverse to the vertical direction.

10. The module of claim 1, comprising:
    at least one further electric and/or electronic component thermally connected to a planar shaped third face of the evaporator opposite a planar shaped second face of the evaporator.

11. The module of claim 1, wherein the module comprises at least one first fan being arranged at at least one of:
    a) the inlet, and
    b) the outlet.

12. The module of claim 1,
wherein the evaporator has a maximum thickness extending in a second main normal direction running perpendicularly to the planar second face of the evaporator, the maximum thickness of the evaporator being smaller than a maximum overall width of the evaporator extending in a lateral direction running perpendicularly to the second main normal direction such that a maximum-thickness-to-maximal-width-ratio confers a flat plate-like overall appearance on the evaporator.

13. The module of claim 12, wherein the maximum-thickness-to-maximal-width-ratio of the evaporator is in a range of about 1:2 to about 1:a, and
wherein a is at least 5.

14. The module of claim 13, wherein a is at least 10.

15. The module of claim 1, wherein the condenser has a maximum thickness extending in a first main normal direction running perpendicularly to the planar first face of the condenser, the maximum thickness of the condenser being smaller than a maximum overall width of the condenser extending in a lateral direction running perpendicularly to the first main normal direction such that a maximum-thickness-to-maximal-width-ratio confers a flat plate-like overall appearance on the condenser.

16. The module of claim 15, wherein the maximum-thickness-to-maximal-width-ratio of the condenser is in a range of about 1:2 to about 1:b, and
wherein b is at least 5.

17. The module of claim 16, wherein b is at least 10.

18. The module of claim 1, wherein the first conduits of the evaporator are dimensioned such that the coolant is vaporizable by convection boiling.

19. The module of claim 1, wherein the evaporator includes a heat transfer element, which is mechanically and thermally connected to the plurality of first conduits, and
wherein the planar second face is provided on the heat transfer element.

20. An electric and/or electronic system with a cabinet, the cabinet comprising:
at least two modules according to claim 1,
a cabinet housing including a first aperture for receiving a stream of cooling air, and a second aperture for releasing the cooling air thereafter in an operating state of the cabinet;
wherein the at least two modules are arranged in the cabinet housing such that a major portion of the stream of cooling air flowing through the first aperture of the cabinet housing is divided into partial streams of cooling air, the guiding structure enabling at least some of the partial streams to flow into their dedicated module via the inlet through the dedicated module to the outlet of the dedicated module, respectively, such that at least two of the partial streams of cooling air are connected in parallel to one another and thereafter leave the cabinet together through the second aperture of the cabinet housing in an operating state of the cabinet.

21. The electric and/or electronic system of claim 20, wherein the at least two modules are arranged side-by-side of one another along a vertical direction of the cabinet; the vertical direction being transverse to the horizontal direction, and
wherein the cooling air flows in a direction transverse to the horizontal direction of the cabinet in an operating state of the cabinet.

22. The electric and/or electronic system of claim 20, wherein the at least two modules are arranged on top of one another along a vertical direction of the cabinet, and
wherein the cooling air flows in a direction transverse to the vertical direction of the cabinet through the modules in an operating state of the cabinet.

23. The electric and/or electronic system of claim 22, wherein the at least two modules are arranged side-by-side of one another along a horizontal direction of the cabinet; the vertical direction being transverse to the horizontal direction, and
wherein the cooling air flows in a direction transverse to the horizontal direction of the cabinet in an operating state of the cabinet.

24. The electric and/or electronic system of claim 20, the cabinet comprising:
at least one module block including at least one module of the at least two modules; and
a module block enclosure,
wherein the at least two modules are electrically connectable via a connector from at least one of inside and outside the module block, and
wherein at least one of:
(a) the module block enclosure includes a first port for receiving the stream of cooling air, the module block enclosure for guiding the cooling air to the inlet of each of the modules, and the module block enclosure including a second port for releasing the cooling air thereafter in an operating state of the cabinet; and
(b) the at least one module block together with the at least two modules each have a first guiding means, and the cabinet has a second guiding means, the first guiding means and the second guiding means being formed such that the at least one module block and the at least two modules are insertable and deployable in a drawer-like manner in and out of the cabinet.

25. The electric and/or electronic system of claim 1, wherein the guiding structure is formed such that the design of the module is made compact by having approximately 50% of internal space available in the guiding structure in the flow direction between the inlet and outlet occupied by the thermosiphon cooler including the evaporator and the condenser, and the electric and/or electronic component.

26. The electric and/or electronic system of claim 1, wherein the guiding structure is formed as a rectangular structure having opposing first and second sides extending in a first direction, and opposing third and fourth sides extending in a second direction perpendicular to the first direction.

* * * * *